(12) United States Patent
Park et al.

(10) Patent No.: US 10,999,921 B2
(45) Date of Patent: May 4, 2021

(54) CIRCUIT BOARD FOR REDUCING TRANSMITTING LOSS AND ELECTRONIC DEVICE THEREWITH

(71) Applicant: Samsung Electronics Co., Ltd., Gyeonggi-do (KR)

(72) Inventors: Chan-Gi Park, Gyeonggi-do (KR); Yikyu Min, Gyeonggi-do (KR); Han Min Cho, Gyeonggi-do (KR); Yeonsang Yun, Gyeonggi-do (KR); Tae-Wook Ham, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 211 days.

(21) Appl. No.: 16/007,268

(22) Filed: Jun. 13, 2018

(65) Prior Publication Data
US 2018/0359845 A1    Dec. 13, 2018

(30) Foreign Application Priority Data
Jun. 13, 2017    (KR) ......................... 10-2017-0073976

(51) Int. Cl.
*H05K 1/02* (2006.01)
*H05K 5/00* (2006.01)
(Continued)

(52) U.S. Cl.
CPC ............. *H05K 1/024* (2013.01); *H01P 3/003* (2013.01); *H01P 3/08* (2013.01); *H01P 3/081* (2013.01); *H01P 3/085* (2013.01); *H01Q 1/22* (2013.01); *H01Q 1/243* (2013.01); *H01Q 9/0421* (2013.01); *H01Q 21/28* (2013.01); *H05K 1/025* (2013.01); *H05K 5/0017* (2013.01); *H05K 2201/0187* (2013.01); *H05K 2201/10098* (2013.01)

(58) Field of Classification Search
CPC ... H01L 21/563; H01L 21/4857; H01L 23/66; H01L 23/645; H05K 1/02; H05K 1/0236; H05K 1/0251; H05K 5/007; H01P 3/00; H01P 3/003; H01P 3/08; H01P 3/081; H01P 3/085
USPC ....... 361/760, 775, 777–778, 814, 816, 818; 174/250–262
See application file for complete search history.

(56) References Cited

U.S. PATENT DOCUMENTS

| | | | | |
|---|---|---|---|---|
| 5,921,809 A | * | 7/1999 | Fink .................... | H01M 2/305 439/504 |
| 6,353,189 B1 | * | 3/2002 | Shimada .............. | H01L 21/563 174/255 |

(Continued)

FOREIGN PATENT DOCUMENTS

| | | |
|---|---|---|
| JP | 2015-139042 | 7/2015 |
| KR | 10-2016-0135453 | 11/2016 |

*Primary Examiner* — Tuan T Dinh
(74) *Attorney, Agent, or Firm* — The Farrell Law Firm, P.C.

(57) ABSTRACT

A circuit board is provided in which a transmission loss is reduced. The circuit board includes a first layer; a transmission line disposed on the first layer; and a second layer stacked with the first layer. The second layer includes a first region, which is constructed of a first material, corresponding to a position of the transmission line, and a second region, which is constructed of a second material having a permittivity that is different from that of the first material, corresponding to the position of the transmission line.

16 Claims, 27 Drawing Sheets

(51) Int. Cl.
*H01Q 1/22* (2006.01)
*H01P 3/08* (2006.01)
*H01Q 21/28* (2006.01)
*H01Q 1/24* (2006.01)
*H01P 3/00* (2006.01)
*H01Q 9/04* (2006.01)

(56) References Cited

U.S. PATENT DOCUMENTS

| | | | | |
|---|---|---|---|---|
| 6,356,173 | B1* | 3/2002 | Nagata | H01L 23/66 |
| | | | | 257/664 |
| 6,807,065 | B2* | 10/2004 | Sato | H01P 1/047 |
| | | | | 174/261 |
| 8,258,408 | B2* | 9/2012 | Kim | H05K 1/0236 |
| | | | | 174/250 |
| 8,295,058 | B2* | 10/2012 | Cahill | H05K 1/0251 |
| | | | | 361/794 |
| 9,705,180 | B2* | 7/2017 | Darnell | H01Q 1/243 |
| 2003/0006063 | A1* | 1/2003 | Otsuka | H05K 1/0245 |
| | | | | 174/256 |
| 2004/0012938 | A1* | 1/2004 | Sylvester | H01L 21/4857 |
| | | | | 361/794 |
| 2004/0048420 | A1 | 3/2004 | Miller | |
| 2007/0262828 | A1* | 11/2007 | Fujita | H01P 5/107 |
| | | | | 333/26 |
| 2008/0080155 | A1* | 4/2008 | Ye | H05K 1/0248 |
| | | | | 361/777 |
| 2009/0032285 | A1* | 2/2009 | Ueda | H05K 1/024 |
| | | | | 174/250 |
| 2009/0080172 | A1* | 3/2009 | Arslan | H05K 1/0236 |
| | | | | 361/816 |
| 2009/0161294 | A1* | 6/2009 | Kim | H01G 4/30 |
| | | | | 361/321.5 |
| 2010/0232084 | A1* | 9/2010 | Niki | H01L 23/645 |
| | | | | 361/301.4 |
| 2014/0133114 | A1* | 5/2014 | Saji | H05K 1/0253 |
| | | | | 361/760 |
| 2016/0044835 | A1 | 2/2016 | Lee et al. | |
| 2016/0336654 | A1 | 11/2016 | Aoki et al. | |
| 2016/0338204 | A1 | 11/2016 | McMullen et al. | |

* cited by examiner

CIRCUIT BOARD FOR REDUCING TRANSMITTING LOSS AND ELECTRONIC DEVICE THEREWITH

CROSS REFERENCE TO RELATED APPLICATION(S)

This application is based on and claims priority under 35 U.S.C. § 119 to Korean Patent Application No. 10-2017-0073976, filed on Jun. 13, 2017, in the Korean Intellectual Property Office, the disclosure of which is incorporated by reference herein in its entirety.

BACKGROUND

1. Field

The present disclosure relates generally to a circuit board having a transmission line for reducing a transmission loss, and an electronic device including the circuit board.

2. Description of Related Art

When a high-frequency Radio Frequency (RF) signal is transmitted in a typical printed circuit board, a transmission loss occurs due to a physical property of the printed circuit board, thereby limiting a distance for transmitting the high-frequency RF signal. For example, the transmission loss may be caused by a conductor and/or a dielectric material of the printed circuit board.

In such a conventional printed circuit board, there is a problem in that a transmission loss is relatively great in comparison with a coaxial cable, when the transmission line for transmitting a high frequency RF signal is longer than a specific distance.

SUMMARY

The present disclosure has been made to address at least the disadvantages described above and to provide at least the advantages described below.

An aspect of the present disclosure is to provide a circuit board for reducing signal transmission loss when a high frequency RF signal is transmitted in the circuit board, and an electronic device including the circuit board.

Another aspect of the present disclosure is to provide a circuit board for reducing transmission loss without a distance restriction, and an electronic device including the circuit board.

Another aspect of the present disclosure is to provide a circuit board for minimizing transmission loss of a transmission line when a signal is transmitted between external metal frames used as an antenna radiator in an RF block, and an electronic device including the circuit board.

In accordance with an aspect of the present disclosure, a circuit board is provided, which includes a first layer; a transmission line disposed on the first layer; and a second layer stacked with the first layer. The second layer comprises a first region, which is constructed of a first material, corresponding to a position of the transmission line, and a second region, which is constructed of a second material having a permittivity that is different from that of the first material, corresponding to the position of the transmission line.

In accordance with another aspect of the present disclosure, an electronic device is provided, which includes a housing; a display; a circuit board; and a segmented external metal frame. The circuit board comprises a first dielectric layer; a conductive layer disposed on the first dielectric layer; and a second dielectric layer stacked with the first dielectric layer. The second dielectric layer comprises a first region, which is constructed of a first material, and a second region, which is adjacent to the first region and is constructed of a second material having a permittivity that is different from that of the first material, corresponding to a position of the conductive layer.

In accordance with another aspect of the present disclosure, a circuit board is provided, which includes a first layer; a transmission line disposed on the first layer; and a second layer stacked with the first layer. The second layer comprises a first region that is constructed of a first material, and a second region, which is constructed of a second material having a permittivity that is different from that of the first material, corresponding to the position of the transmission line. The first region comprises a first support structure supporting the second region. The first support structure comprises the first material located stacked in a layered manner and spaced vertically; and an interlayer adhesive layer, which is disposed between the first layered materials.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
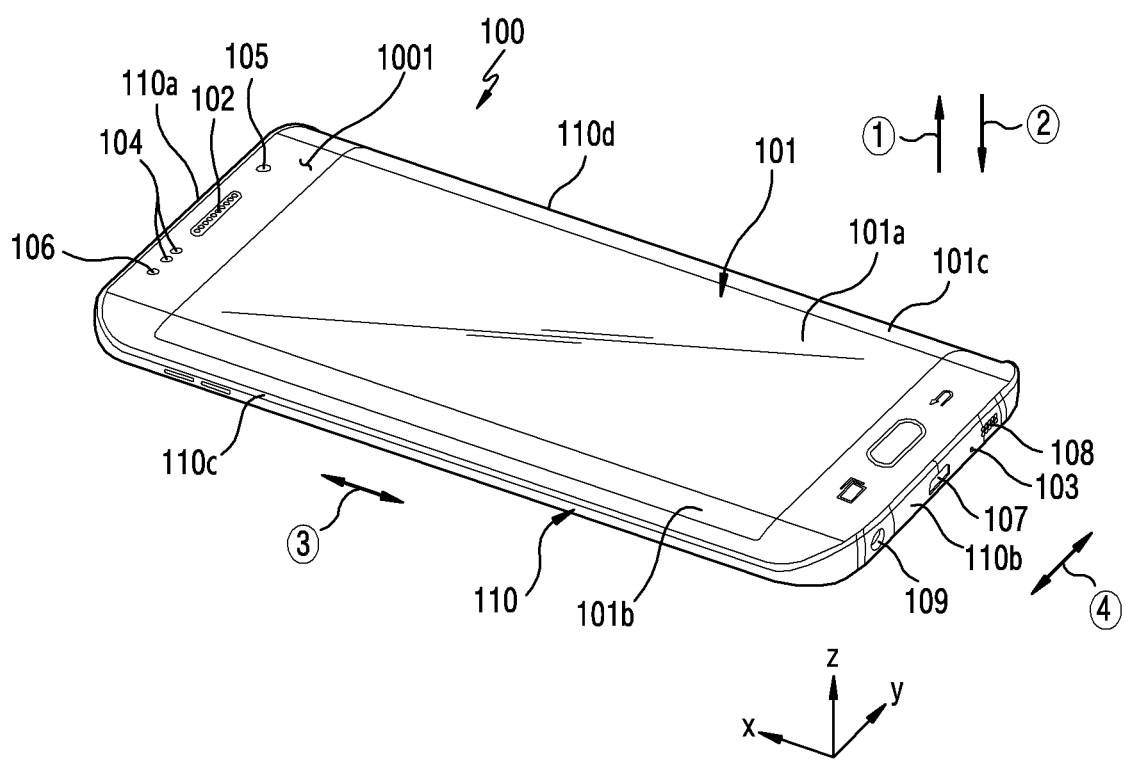
FIG. 1A illustrates a front side of an electronic device according to an embodiment.

Hereinafter, various embodiments of the present disclosure are described with reference to accompanying drawings. However, the present disclosure is not limited to these specific embodiments, and it should be understood that modifications, equivalents, and/or alternatives of the embodiments described herein can be made.

With regard to description of drawings, similar components may be marked by similar reference numerals.

Terms and expression used in the present disclosure are used to describe specified embodiments of the present disclosure and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. Further, terms that are defined in a dictionary and commonly used, should also be interpreted as is customary in the relevant related art and not in an idealized or overly formal way, unless expressly so defined as such herein. In some cases, even if terms are defined in the specification, they may not be interpreted to exclude embodiments of the present disclosure.

Herein, the expressions "have," "may have," "include" and "comprise," "may include" and "may comprise" indicate the existence of corresponding features (e.g., elements such as numeric values, functions, operations, or components), but do not preclude the presence of additional features.

The expressions "A or B," "at least one of A or/and B," and "one or more of A or/and B" may include any and all combinations of one or more of the associated listed items. For example, the expression "A or B," "at least one of A and B," or "at least one of A or B" may refer to (1) where at least one A is included, (2) where at least one B is included, or (3) where both of at least one A and at least one B are included.

Numerical terms, such as "first," "second," etc., used herein, may refer to various elements of various embodiments of the present disclosure, but do not limit the referenced elements. For example, such terms do not limit the order and/or priority of the elements. Further, such terms may be used to distinguish one element from another element. Accordingly, "a first user device" and "a second user device" may indicate different user devices regardless of the order or priority. Consequently, a first element may be referred to as a second element, and similarly, a second element may be referred to as a first element.

When an element (e.g., a first element) is referred to as being "(operatively or communicatively) coupled with/to" or "connected to" another element (e.g., a second element), the first element can be directly coupled with/to or connected to the second element or indirectly coupled with/to or connected to the second element via an intervening element (e.g., a third element). In contrast, when the first element is referred to as being "directly coupled with/to" or "directly connected to" the second element, there is no intervening element therebetween.

According to the situation, the expression "configured to (or set to)" may be interchangeably used as with the expression "suitable for," "having the capacity to," "designed to," "adapted to," "made to," or "capable of". The term "configured to (or set to)" does not mean only "specifically designed to" in hardware, but may indicate that a device is "capable of" operating together with another device or other components. For example, a "processor configured to (or set to) perform A, B, and C" may indicate a dedicated processor (e.g., an embedded processor) for performing a corresponding operation or a generic-purpose processor (e.g., a central processing unit (CPU) or an application processor (AP)) that may perform corresponding operations by executing one or more software programs which are stored in a memory device.

Electronic device according to the present disclosure may include smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

The electronic devices may also be smart home appliances, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, electronic picture frames, etc.

The electronic devices may include medical devices (e.g., various portable medical measurement devices, such as blood glucose monitoring devices, heartbeat measuring devices, blood pressure measuring devices, body temperature measuring devices, etc., magnetic resonance angiography (MRA) devices, magnetic resonance imaging (MRI) devices, computed tomography (CT) devices, scanners, and ultrasonic devices), navigation electronic devices, global positioning system receivers (GPSs), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller machines (ATMs), points of sales (POSs) devices, or Internet of things (IoT) devices (e.g., light bulbs, various sensors, electric or gas meters, sprinkler devices, fire alarms, thermostats, street lamps, toasters, exercise equipment, hot water tanks, heaters, boilers, etc.).

The electronic devices may include parts of furniture or buildings/structures, electronic boards, electronic signature receiving devices, projectors, or various measuring instruments (e.g., water meters, electricity meters, gas meters, wave meters, etc.).

The electronic devices may be flexible electronic devices.

The electronic devices may also be one or more combinations of the above-mentioned devices.

However, the electronic devices are not limited to the above-described devices, and may include new electronic devices according to technology development.

Figure 1B:
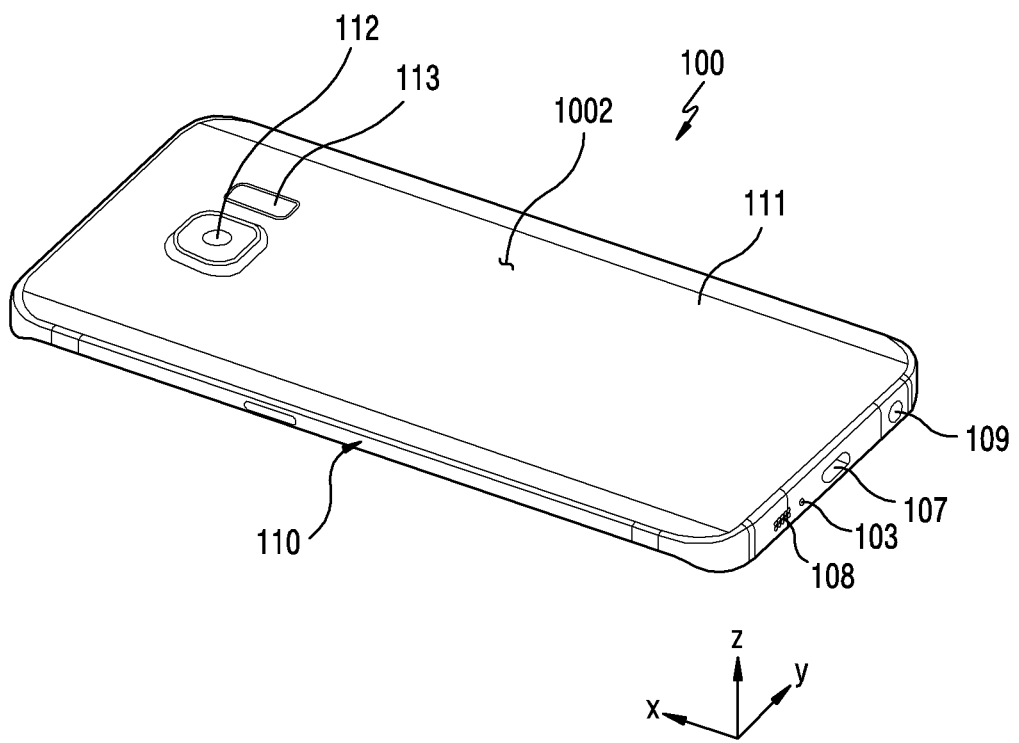
FIG. 1B illustrates a rear side of an electronic device according to an embodiment.

FIG. 1A illustrates a front side of an electronic device according to an embodiment. FIG. 1B illustrates a rear side of an electronic device according to an embodiment.

Herein, an orthogonal coordinate system is used in which an X-axis refers to a horizontal direction of an electronic device, a Y-axis refers a vertical direction of the electronic device, and a Z-axis refers to a thickness direction of the electronic device.

Referring to FIGS. 1A and 1B, an electronic device 100 includes a housing 110, which includes a first side facing a first direction ①, a second side facing a second direction ② opposite to the first direction ①, and a lateral side facing a lateral direction perpendicular to each of the first and second directions ① and ② and at least partially covering a space between the first and second sides. The lateral direction may be a third direction ③ or a fourth direction ④, or may include both the third and fourth directions ③ and ④. The first side of the housing 110 may be a first plate, and the second side of the housing 110 may be a second plate.

In the housing 110, the first side may be an upper side of the housing when the first direction ① faces an upward direction, and the second side may be a rear side of the housing when the second direction ② faces a downward direction. For example, in the housing 110, the first side may be a front side when the first direction ① faces the upward direction, and the second side may be a rear side when the second direction ② faces the downward direction.

The housing 110 includes a plurality of lateral sides, e.g., a lateral side of an upper edge 110a of the housing 110, a lateral side of a lower edge 110b of the housing, a side of a left edge 110c of the housing, and a lateral side of a right edge 110d of the housing. The upper edge 110a, the lower edge 110b, the left edge 110c, and the right edge 110d may together constitute a rim or boundary of the electronic device 100.

The electronic device 100 includes a display 101. The display 101 includes a flat display 101a and curved displays 101b and 101c disposed on at least one edge region of the flat display 101a. For example, the display 101 may occupy at least 50% of an area of the housing 110. The display 101 may include a display module and a transparent member (e.g., a glass cover or a transparent window). The display module may include a display panel and a touch panel. The flat display 101a and the curved displays 101b and 101c may be configured by one flexible-type display module.

The flat display 101 may include first and second displays 101b and 101c disposed on a circumferential portion, that is, left and right edges. Although FIGS. 1A and 1B illustrate the first and second curved displays 101b and 101c being disposed at left and right edges of the flat display 101, the curved display may be located at various edge regions without being limited to the illustrated position.

For example, the curved display may be disposed on any one of the upper edge 110a, the lower edge 110b, the left edge 110c, the right edge 110d, the upper and lower edges 110a and 110b, the left and right edges 110c and 110d, and the upper, lower, left and right edges 110a, 110b, 110c, and 110d. The upper and lower edges 110a and 110b to which first and second displays 122 and 123 are not displayed may include a portion of a metal housing. For example, the portion of the metal housing may be an outer metal frame separated by an insulator, and thus, may operate as an antenna radiator.

The electronic device 100 includes a speaker 102 disposed to output the voice of a caller. The electronic device 100 includes a microphone device 103 to receive a user's voice.

The electronic device 100 may have components disposed around the speaker 102, to perform various functions of the electronic device 100. For example, the components may include at least one sensor module 104, such as an illumination sensor (e.g., a light sensor), a proximity sensor (e.g., a light sensor), an infrared sensor, an ultrasonic sensor, a fingerprint sensor, and an iris sensor. The components may also include a front camera device 105 and an indicator 106 (e.g., a light emitting diode (LED) device) that changes color to represent state information of the electronic device 100.

The electronic device 100 includes another speaker device 108 disposed at one side of the microphone device 103, and an interface connector port 107 disposed at the other side of the microphone device 103 to charge the electronic device 100 by being provided with a data transmission/reception function and external power by an external device. The electronic device 100 includes an earphone jack 109 disposed at one side of the interface connector port 107.

The housing 110 may be constructed of a conductive member and a non-conductive member. The housing 110 may be disposed along a rim of the electronic device 100, and may be disposed in such a manner that it extends to a portion of a front side or at least part of a rear side. The housing 110 defines at least part of a thickness of the electronic device 100 along the rim of the electronic device 100, and may have a closed loop shape. However, without being limited thereto, the housing 110 may be disposed on at least part of the thickness of the electronic device 100. At least part of the housing 110 may be included inside the electronic device 100.

The electronic device 100 includes a rear window 111 disposed on the second side (e.g., the rear side). The electronic device 100 includes a rear camera device 112 disposed through the rear window 111. The electronic device 100 includes at least one electronic component 113 disposed on one side of the rear camera device 112. For example, the electronic component 113 may include an illumination sensor (e.g., a light sensor), a proximity sensor (e.g., a light sensor), an infrared sensor, an ultrasonic sensor, a heart rate sensor, a flash device, and/or a finger print sensor.

Figure 2:
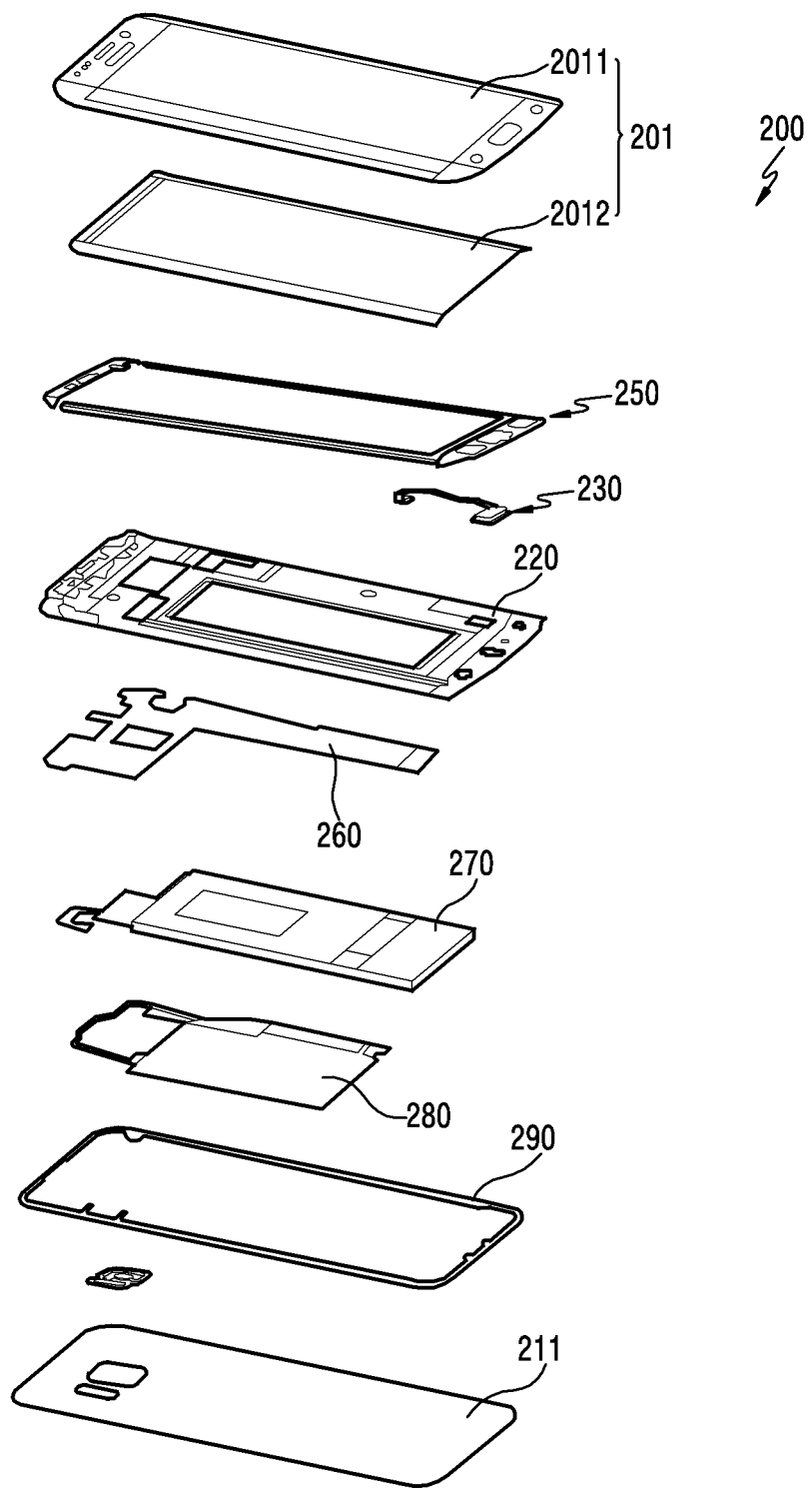
FIG. 2 illustrates an exploded perspective view of an electronic device according to an embodiment.

FIG. 2 illustrates an exploded view of an electronic device according to an embodiment. The electronic device 200 of FIG. 2 may be similar to the electronic device 100 of FIGS. 1A and 1B.

Referring to FIG. 2, the electronic device 200 includes a key input device 230, a seal member 250, and a display 201 including a display module 2012 and a window 2011, which are disposed sequentially at an upper side of a housing 220. The electronic device 200 includes a printed circuit board (PCB) 260 (e.g., a flexible PCB (FPCB), a main board, etc.), a rechargeable battery 270, a wireless power transmission/reception member 280, a rear seal member 290, and a rear window 211, which are disposed sequentially at a lower side of the housing 220.

The rechargeable battery 270 may be accommodated in an accommodating space provided in a housing 220, and may be disposed by avoiding the printed circuit board 260. The rechargeable battery 270 and the PCB 260 may be disposed in a parallel manner without overlapping. However, the present disclosure is not limited thereto, and at least some regions of the rechargeable battery 270 may be disposed to overlap with the PCB 260.

Although the housing 220 is used alone in FIG. 2, at least one plate (e.g., a central plate, a rear plate, a detachable battery cover, etc.) coupled to the housing 220 may also be used together. The housing 220 may be constructed by using a conductive member (e.g., a metal member, etc.) and a non-conductive member (e.g., resin, etc.) through an insert injection process or a double injection process.

The display 201 may be assembled to the housing 220 after the display module 2012 is attached to a rear side of the window 2011. The window 2011 may be constructed of a transparent material such as glass, resin, etc. The display module 2012 may include a touch sensor. The display module may include a touch sensor and a force sensor.

The electronic device 200 includes the seal member 250 disposed between the housing 220 and the display 201 for the purpose of waterproofing. Additionally, the electronic device 200 includes a seal member 290 disposed between a rear side of the housing 220 and the rear window 211 along a boundary thereof for the purpose of waterproofing. The seal members 250 and 290 may include tapes, adhesive agents, waterproof dispensing, silicon, waterproof rubber, and/or urethane.

The rear window 211 may be constructed of at least one material among glass, plastic, synthetic resin, and metal.

The PCB 260 may include a memory, a processor, various sensors, an input/output terminal, etc., and may perform various functions of the electronic device 200 by using power supplied from the rechargeable battery 270. The PCB 260 may be disposed adjacent to the rechargeable battery 270. The PCB 260 may be disposed in such a manner that at least one side thereof is in contact with one side of the rechargeable battery 270, and thus, at least one part thereof overlaps with the battery 270, or may be disposed in such a manner that the same plane is occupied in a divided manner with respect to the rechargeable battery 270 by being configured in a shape of 'L' or 'L', which avoids a space for arranging the rechargeable battery 270.

The rechargeable battery 270 provides power to primary components such as the display 201, the printed circuit board 260, etc., and may provide a mounting plane such as the wireless power transmission/reception member 280, various sheet-type sensors, etc. The rechargeable battery 270 may be disposed in a battery pack placement region in which a specific space is ensured due to a mounting cavity space, a guide rib, etc., prepared in some regions of the housing 220 to provide reliable assembling and to avoid movement during use. The rechargeable battery 270 may be used as a built-in battery (e.g., a built-in battery packet) embedded in the electronic device 200, or may be detached from the electronic device by a user for the purpose of replacement when a battery cover is open.

The rechargeable battery 270 may include a battery pouch in which a battery cell is supported, a protective circuit module (PCM) (e.g., a circuit board) to which a terminal pulled out from the battery pouch is electrically coupled, and a case (e.g., a PCM housing or a PCM case) for protecting the PCM. The case in which the PCM is accommodated may be fixed to the battery pouch in an assembly structure for improving impact resistance, and thus, constitutional elements (e.g., a battery pouch, a PCM, a terminal, etc.) of the battery can be prevented from damage even if an external impact is applied to the electronic device.

Figure 3:
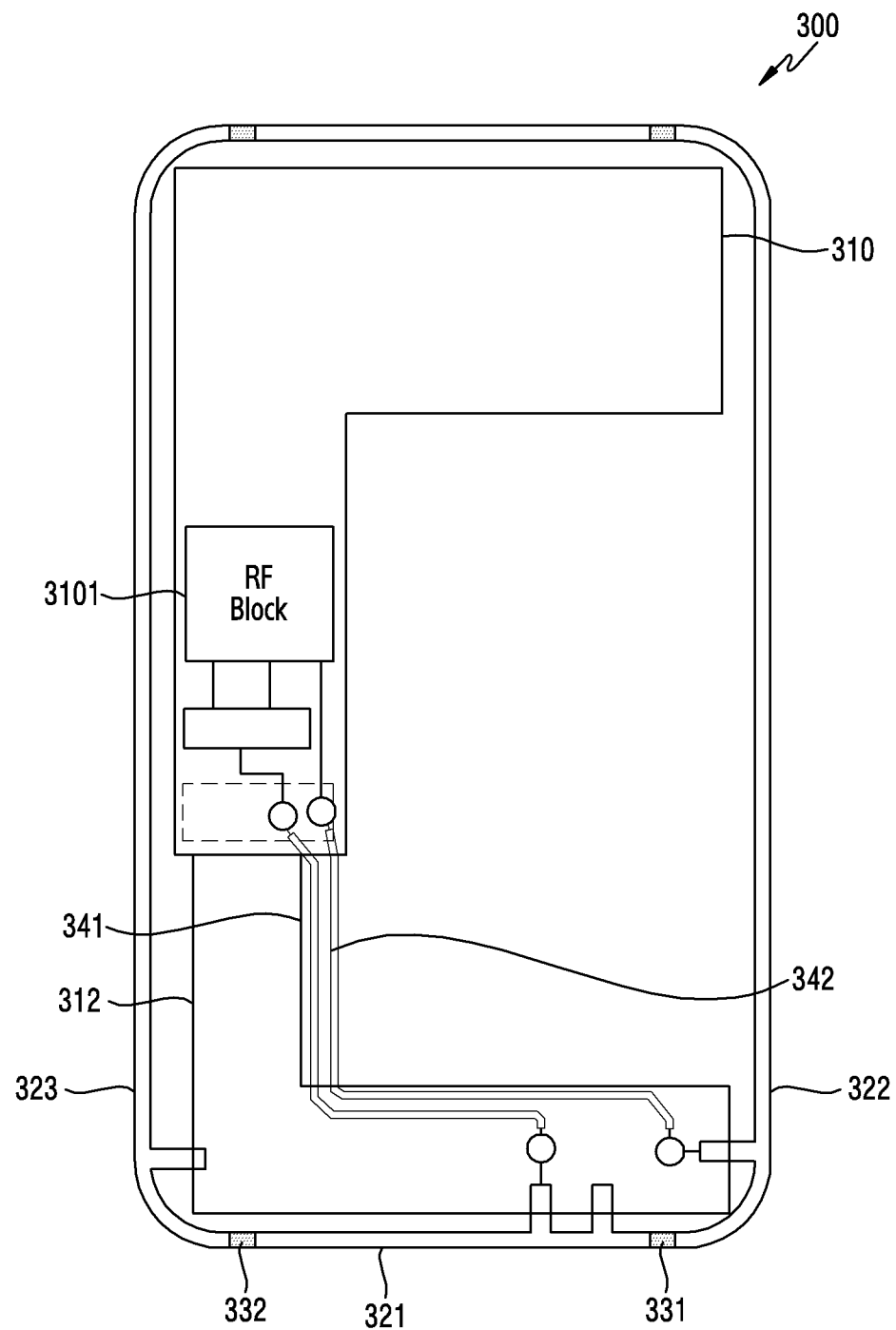
FIG. 3 illustrates a Radio Frequency (RF) block of an electronic device conventionally coupled to an antenna radiator by a coaxial cable.

FIG. 3 illustrates an RF block of an electronic device conventionally coupled to an antenna radiator by a coaxial cable.

Referring to FIG. 3, an electronic device 300 includes main and sub circuit boards 310 and 312, an RF block 3101, antenna radiators 321, 322, and 323, and RF coaxial cables 341 and 342.

The main and sub circuit boards 310 and 312 may be disposed inside a housing, and various electronic components, such as a memory, a processor, a sensor, an input/output terminal, the RF block 3101, etc., may be mounted thereon. The circuit board may be constructed of at least one board, and includes a main circuit board 310 and a sub circuit board 312. The main circuit board 310 and the sub circuit board 312 may be disposed in parallel without having to overlap with a battery pack, and thus, may be constructed in a rectangular shape.

The antenna radiators 321, 322, and 323 may be disposed at a lateral side of the housing, and thus, at least one of the antenna radiators 321, 322, and 323 may be coupled to the housing in a segmented form. The antenna radiators 321, 322, and 323 may include at least one exterior metal frame disposed on at least part of the lateral side of the housing. The segmented portions 331 and 332 between the antenna radiators 321, 322, and 323 may be filled with an insulating material.

The first and second coaxial cables 341 and 342 electrically couple the RF block 3101 disposed on the main circuit board 310 to the antenna radiators 321 and 322. For example, the first coaxial cable 341 delivers a low-band/mid-band signal and the second coaxial cable 342 delivers a high-band signal.

However, if a distance between the RF block 3101 and the antenna radiators 321 and 322 is greater than or equal to a specific distance, there is a problem in that a signal transmission loss is increased due to a physical property of the main circuit board 310 and the first and second coaxial cables 341 and 342. Therefore, there may be a distance restriction in the transmitting of the high frequency RF signal.

Figure 4:
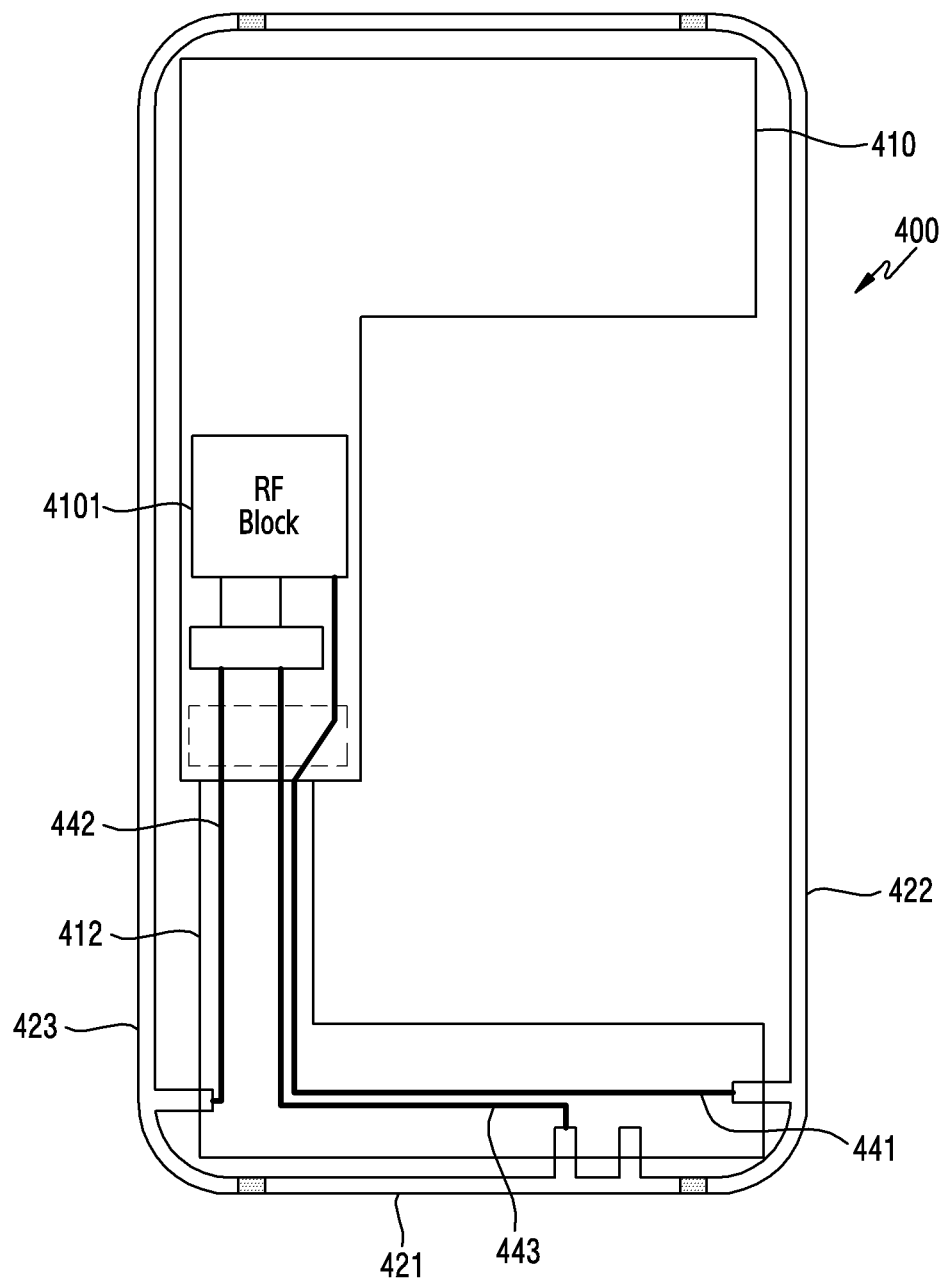
FIG. 4 illustrates an RF block of an electronic device coupled to an antenna radiator by a transmission line according to an embodiment.

FIG. 4 illustrates an RF block of an electronic device coupled to an antenna radiator by a transmission line according to an embodiment.

Referring to FIG. 4, an electronic device 400 includes main and sub PCBs 410 and 412, an RF block 4101, antenna radiators 421, 422, and 423, and transmission lines 441, 442, and 443. The electronic device 400 differs from the electronic device of FIG. 3 only in a structure for electrically coupling the RF block 4101 and the antenna radiators 421, 422, and 423, and thus, descriptions on the same remaining structures will be omitted to avoid redundancy.

The electronic device 400 may electrically couple the RF block 4101 and each of the antenna radiators 421, 422, and 423 by using the first to third transmission lines 441, 442, and 443. The first and second transmission lines 441 and 442 deliver a low-band/mid-band signal, and the third transmission line 443 delivers a high-band signal on the basis of a band.

However, if the distance between the RF block 4101 and one of the antenna radiators 421, 422, and 423 is greater than or equal to a specific distance, a dielectric loss may occur while the transmitting a high frequency RF signal between the two.

As a result, when the high frequency RF signal is transmitted on a transmission line that is greater than or equal to approximately several centimeters, a high transmission loss (i.e., a loss caused by a conductor+a loss caused by a dielectric material) of up to several dB may occur.

Figure 5A:
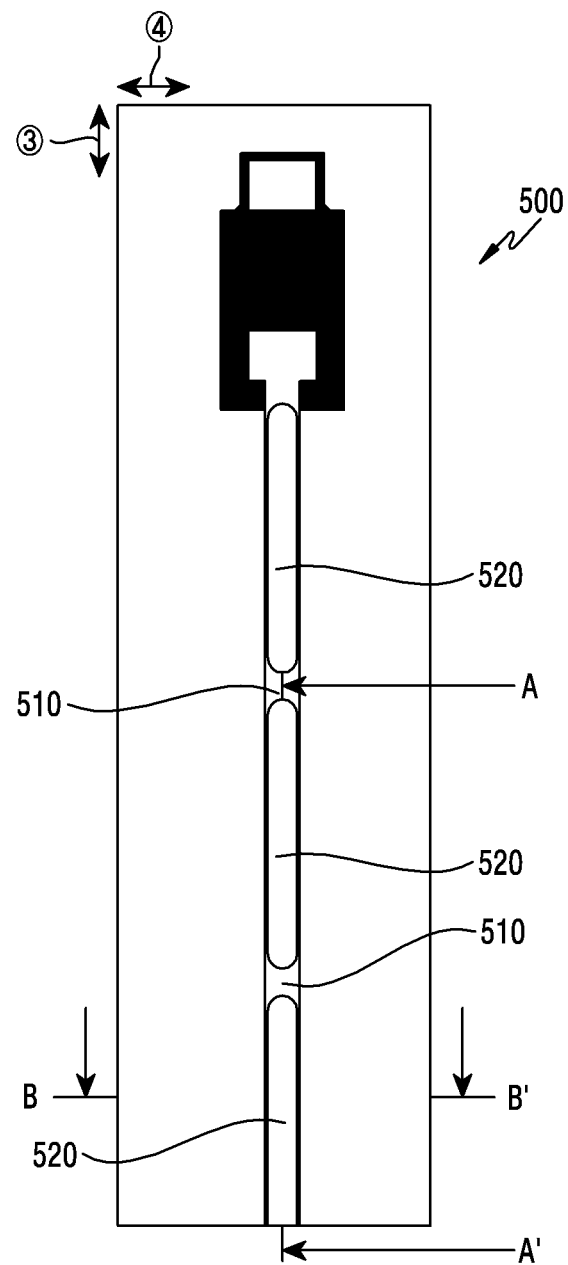
FIG. 5A illustrates a circuit board according to an embodiment.
Figure 5B:
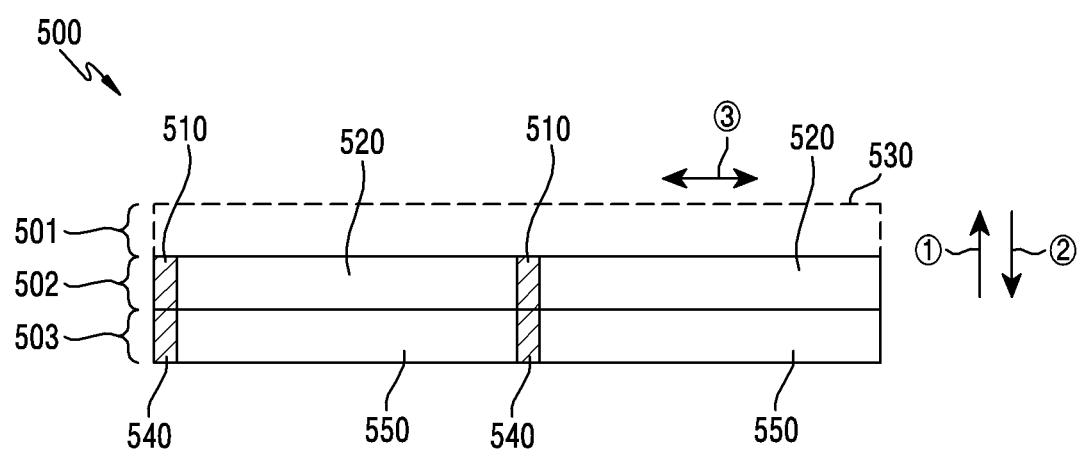
FIG. 5B is a cross-sectional view cut along the line A-A' of FIG. 5A.
Figure 5C:
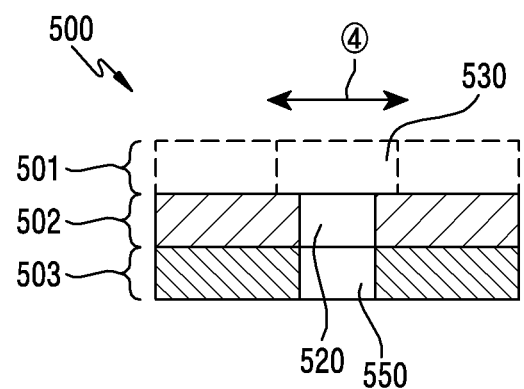
FIG. 5C is a cross-sectional view cut along the line B-B' of FIG. 5A.

FIG. 5A illustrates a circuit board according to an embodiment, FIG. 5B is a cross-sectional view cut along the line A-A' of FIG. 5A, and FIG. 5C is a cross-sectional view cut along the line B-B' of FIG. 5A.

Referring to FIG. 5A to FIG. 5C, a circuit board 500 includes a first layer 501 including a transmission line 530 and a second layer 502 including first and second regions 510 and 520.

The circuit board 500, e.g., a PCB, may be constructed of a rigid material, a flexible material, or a combination of the rigid material and the flexible material. A variety of electronic components may be mounted on the circuit board 500, such as a memory, a processor, a sensor, a microphone device, a front camera device, an indicator, an interface connector port, a speaker device, an input/output terminal, and an RF block.

The first layer 501 includes a transmission line 530 disposed in a third direction in which the transmission line 530 is extended.

The transmission line 530 may include a strip line, a micro strip line, or a coplanar waveguide having a ground. The transmission line 530 may be disposed on the circuit board 500 as at least one line, and in particular, may be used as a transmission line for delivering a high frequency RF signal to the antenna radiator. The first layer 501 may be divided into a region in which the transmission line 530 is disposed and a region in which the transmission line 530 is not disposed.

The first layer 501 may include a first side facing a first direction and a second side facing a second direction opposite to the first direction. The first layer 501 may be constructed of a first material, e.g., a dielectric material having a first permittivity.

The second layer 502 may be stacked with the first layer 501, e.g., on a lower end (a side in the second direction) of the transmission line 530. The second layer 502 includes the first region 510 and the second region 520 existing between the first regions 510 and disposed along the transmission line 530. At least part of the second layer 502 may be repeatedly arranged along the transmission line 530 and may be arranged equidistantly.

The first region 510 of the second layer 502 may include the remaining regions, other than the second region 520. For example, at least part of the first region 510 may be located between the second regions 520. The first region 510 may be constructed of a first material constituting the second layer 502, and the second region 520 located in a region corresponding to a position of the transmission line 530 may be constructed of a second material having a permittivity different from that of the first material e.g., a dielectric material having a second permittivity.

The first region 510 may be constructed of the first material having the first permittivity, and may include at least one first support structure supporting each of the second regions 520 in such a manner that at least part thereof corresponding to the transmission line 530 is disposed between the second regions 520. The first support structure which is at least part of the first region 510 may be disposed between the second regions 520 in a vertical wall type so that a space between the second regions 520 is supported, separated spatially, and encompassed.

The first support structure of the first region 510 may include at least one first material located in a layered manner to be spaced vertically and at least one adhesive layer, each of which is disposed between the first materials.

The second region 520 may be constructed of a second material having a second permittivity, and may be supported by the first region 510 by being disposed between the first support structures as at least part of the first region 510. The second region 520 may be extended along the transmission line 530, may be disposed to be spaced apart, and may be disposed equidistantly.

The second region 520 may be arranged along an extension direction of the transmission line 530, and may be extended in a linear or curved shape. For example, the first support structure of the first region 510 may be disposed on each of front and rear positions about the extension direction in the second region 520. The second region 520 may be constructed as an opening. The transmission line 530 may be exposed to the air due to the air existing in the opening. A horizontal width of the second region 520 may be configured to be smaller than a horizontal width of the transmission line 530. For example, if the second region 520 is exposed to the air, the second region 520 may have a permittivity of the air.

The circuit board 500 includes a third layer 503 disposed at a lower end of the second layer 502. The third region 540 of the third layer 503 may include the remaining regions other than a fourth region 550. For example, at least part of the third region 540 (e.g., a support structure) may be located between the fourth regions 550.

The third layer 503 includes the third region 540 and the fourth region 550 at least partially located between the third regions 540. The third layer 503 may be repeatedly arranged along the transmission line 530 of the fourth region 550, and may be arranged equidistantly.

The third region 540 may be constructed of a third material constituting the third layer 503. Among regions of the third layer 503 corresponding to the transmission line 530, the fourth region 550 may be constructed of a fourth material having a permittivity different from that of the third material.

The third region 540 may be constructed of a third material having a third permittivity, and may be constructed of at least one second support structure supporting each of the fourth region 550 in such a manner that at least part thereof is disposed between the fourth regions 550. The second support structure, which is at least part of the third region 540, may be disposed between the fourth regions 550 in a vertical wall type so that a space between the fourth regions 550 is supported and separated spatially.

The second support structure of the third region 540 may include at least one third material located in a layered manner to be spaced vertically and at least one adhesive layer, each of which is disposed between the third materials.

The fourth region 550 may be constructed of a fourth material having a fourth permittivity, and may be supported by the third region 540 by being disposed between the second support structures as at least part of the third region 540. The fourth region 550 may be extended along the transmission line 530, and may be disposed equidistantly.

The fourth region 550 may be arranged along an extension direction of the transmission line 530, and may be extended in a linear or curved shape. For example, the second support structure, which is at least part of the third region 540, may be disposed on each of front and rear positions about the extension direction in the fourth region 550.

The fourth region 550 may be constructed as an opening. The transmission line 530 may be exposed to the air due to the air existing in the opening. A horizontal width of the fourth region 550 may be configured to be smaller than a horizontal width of the transmission line 530. For example, if the fourth region 550 is exposed to the air, the fourth region 550 may have a permittivity of the air.

Figure 6:
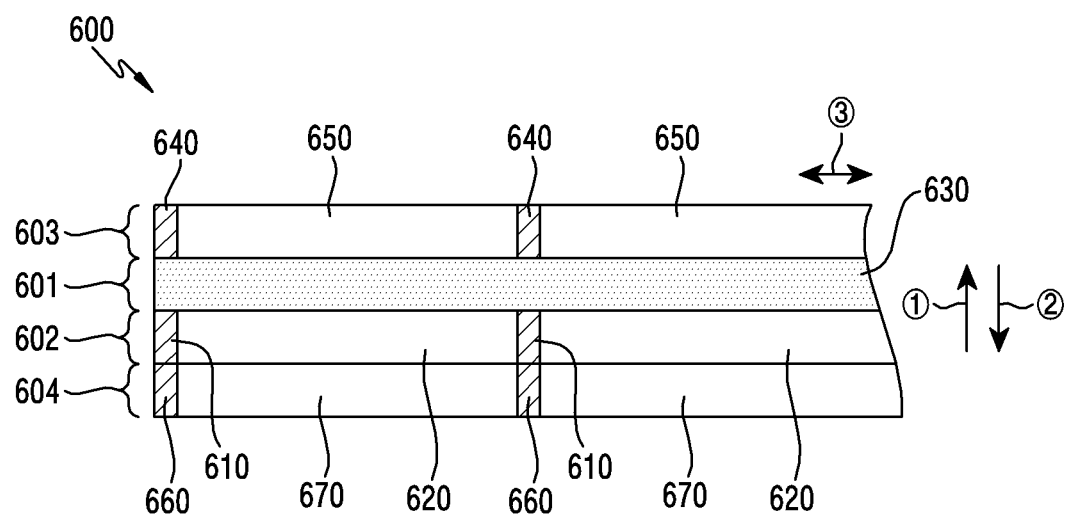
FIG. 6 illustrates a circuit board according to an embodiment.

FIG. 6 illustrates a circuit board according to an embodiment.

Referring to FIG. 6, a circuit board 600 includes a third layer 603 disposed at an upper end (e.g., a first direction) of a first layer 601. The circuit board 600 differs from the circuit board 500 of FIG. 5 only in a position at which the third layer 603 is disposed, and thus, descriptions on the same remaining structures will be omitted to avoid redundancy.

The third layer 603 includes third and fourth regions 640 and 650. The third region 640 may be constructed of a third material constituting the third layer 603. Among regions of the third layer corresponding to the transmission line 630, the fourth region 640 may be constructed of a fourth material having a permittivity different from that of the third material. The third region 640 may be disposed at a position corresponding to the first region 610 disposed at the first layer 601, and the fourth region 650 may be disposed at a position corresponding to the second region 620. The third region 640 may be constructed of a material which is at least partially identical to the first material, and the fourth region 650 may be constructed of a material identical to the second material.

The circuit board 600 further includes a fourth layer 604 at a lower end of the second layer 602. However, since the fourth layer 604 has the same structure as the second layer 602, descriptions thereof will be omitted to avoid redundancy. The fourth layer 604 includes fifth and sixth regions 660 and 670. The fifth and sixth regions 660 and 670 may be configured in the same manner as the first and second regions 610 and 620 of the second layer 602.

Figure 7A:
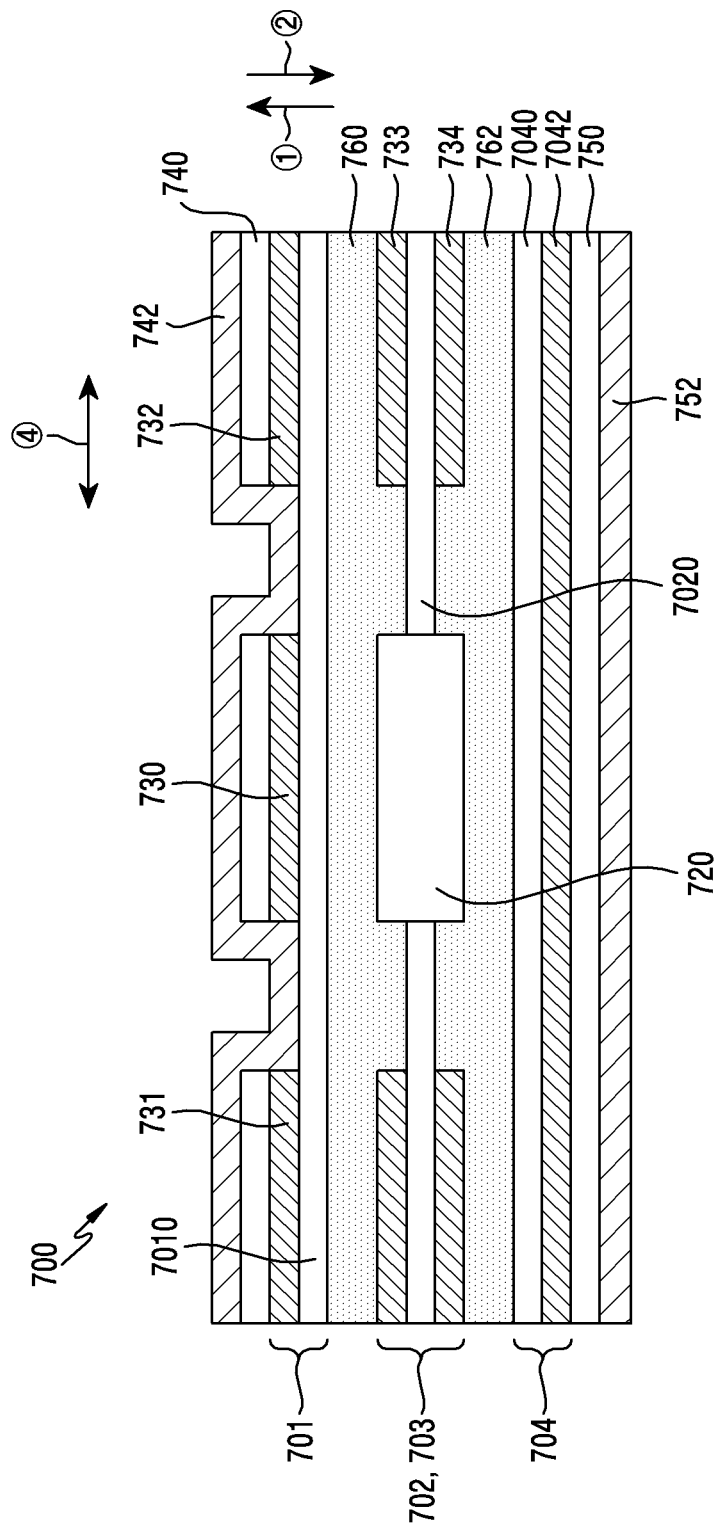
FIG. 7A illustrates a 4-layered circuit board according to an embodiment.
Figure 7B:
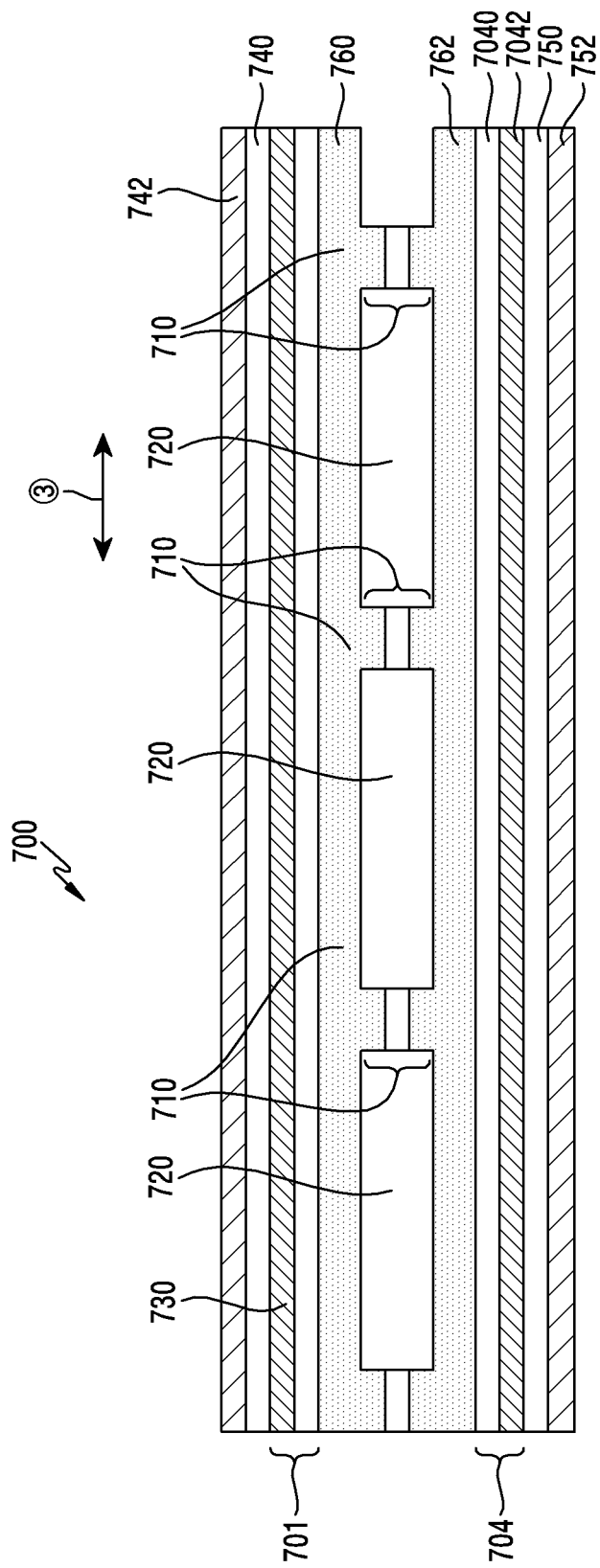
FIG. 7B illustrates a 4-layered circuit board according to an embodiment.

FIG. 7A illustrates a 4-layered circuit board according to an embodiment, and FIG. 7B illustrates a 4-layered circuit board according to an embodiment.

Referring to FIGS. 7A and 7B, a circuit board 700 includes a first outer layer 701, a second outer layer 704, and intermediate layers 702 and 703. Outer plating layers 740 and 750 and outer insulating layers 742 and 752 are disposed respectively on the first and second outer layers 701 and 704.

The first outer layer 701 includes a first film 7010 and a first conductive layer including a transmission line 730 and first and second ground layers 731 and 732, e.g., first copper layers, attached to a first side of the first film 7010. The first outer layer 701 may constitute a first layer of the circuit board 700. For example, the first film 7010 may be constructed of an insulating material. The first conductive layer may be disposed as a single body on the first side of the first film as a copper foil plate.

The transmission line 730 may include, for example, any one of a strip line, a micro strip line, and a coplanar waveguide having a ground. The transmission line 730 may be constructed as at least one line on the circuit board 700, and may be used as a transmission line for delivering a high frequency RF signal to an antenna radiator. The first and second ground layers 731 and 732 may absorb noise or the like, which is generated from the transmission line 730.

The second outer layer 704 includes a second film 7040 and a second conductive layer 7042, e.g., a second copper layer, attached to a second side of the second film 7040. The second outer layer 704 may constitute a fourth layer of the circuit board 700. For example, the second film 7040 may be constructed of an insulating material. The second conductive layer 7042 may be constructed as a single body at the second side of the second film 7040 as a copper foil plate.

The intermediate layers 702 and 703 may be disposed between the first and second outer layers 701 and 704 of the circuit board 700. An intermediate layer may include a third film 7020, a third conductive layer 733 disposed on the first side of the third film 7020, and a fourth conductive layer 734 disposed on the second side of the third film 7020. For example, each of the third and fourth conductive layers 733 and 734 may be a copper layer.

Each of the layers of the circuit board 700 may be stacked by interlayer adhesives 760 and 762 in a manufacturing process. The interlayer adhesive may adhere the first outer layer 701 and the intermediate layers 702 and 703, and may attach the intermediate layers 702 and 703 and the second outer layer 704. For example, the interlayer adhesives 760 and 762 may be constructed of an insulating material to constitute an insulating layer.

The circuit board 700 includes a first region 710 and a second region 720 existing between the first regions 710. The intermediate layer may be arranged repeatedly along the transmission line 730, and may be arranged equidistantly.

At least one first support structure supporting each of the second regions 720 may be included in such a manner that at least part thereof, located along the transmission line 730, is disposed between the second regions 720 among at least some parts of the first region 710. The first support structure may be disposed between the second regions 720 in a vertical wall type, so that a space between the second regions 720 is supported and separated spatially.

The first support structure of the first region 710 may include a first material located in a layered manner in a vertical direction and the one or more adhesive layers 760 and 762 disposed respectively on first and second sides of the first material, e.g., a film dielectric material.

The second region 720 may be arranged along an extension direction the transmission line 730, and may be extended in a linear or curved shape. For example, the first support structure, which is at least part of the first region 710, may be disposed at each of front and rear positions about the extension direction in the second region 720.

The second region 720 may be constructed as an opening, and may be exposed to the air due to the air existing in the opening. For example, if the second region 720 is exposed to the air, the second region 720 may have a permittivity of the air. The opening may be constructed during a manufacturing process of the circuit board 700 by using a drill in a vertical direction in a region corresponding to the transmission line 730 of the second and third layers 702 and 703.

Figure 8A:
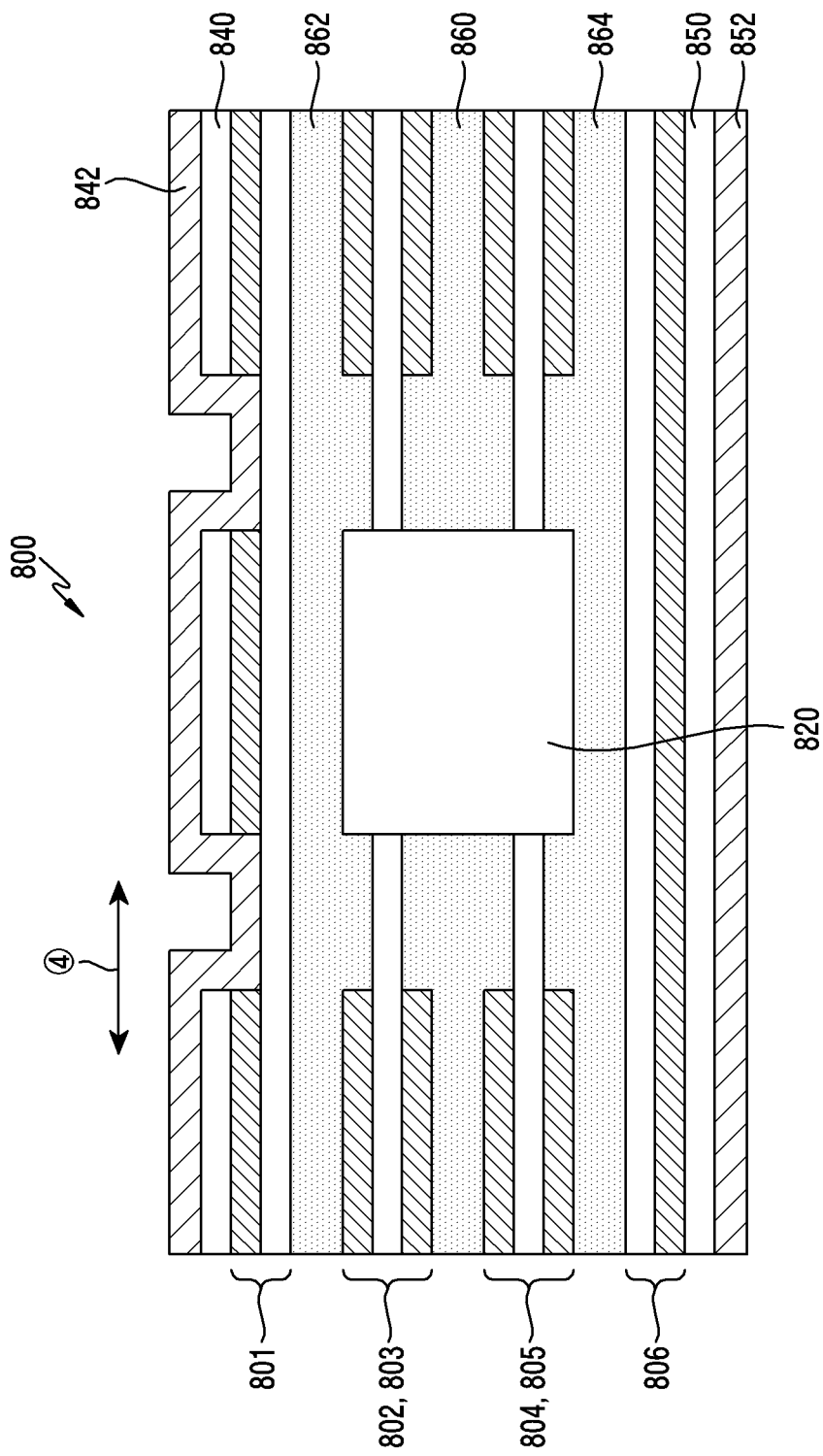
FIG. 8A illustrates a 6-layered circuit board according to an embodiment.
Figure 8B:
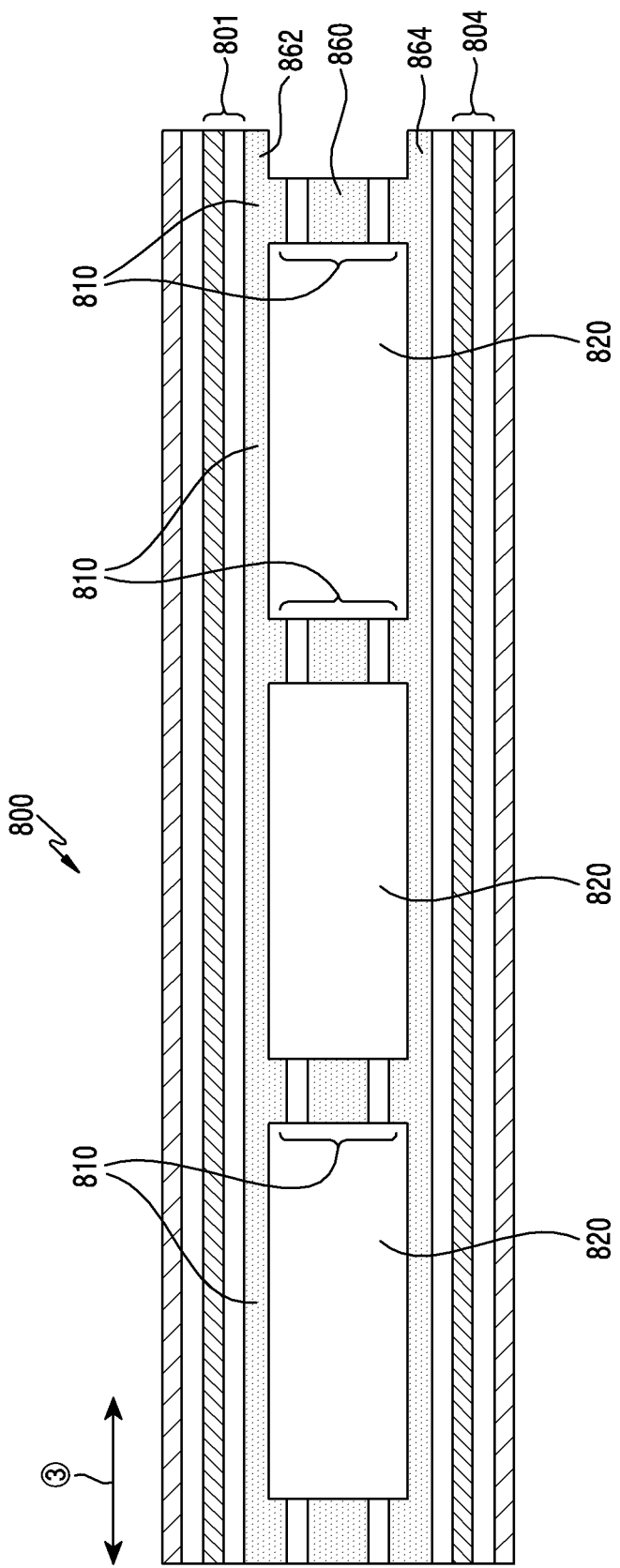
FIG. 8B illustrates a 6-layered circuit board according to an embodiment.

FIG. 8A illustrates a 6-layered circuit board according to an embodiment, and FIG. 8B illustrates a 6-layered circuit board according to an embodiment.

Referring to FIGS. 8A and 8B, a circuit board 800 includes a first outer layer 801, a second outer layer 806, and intermediate layers 802 to 805. For example, the first outer layer 801 may be a first layer. The second outer layer 806 may be a sixth layer. The intermediate layers 802 to 805 may be second to fifth layers. Outer plating layers 840 and 850 and outer insulating layers 842 and 852 are respectively disposed on the first and second outer layers 801 and 806.

The circuit board 800 differs from the circuit board 700 of FIGS. 7A and 7B only in that the circuit board 800 has more intermediate layers, and thus descriptions on the same remaining structures will be omitted to avoid redundancy.

The intermediate layers of the circuit board 800 include the first intermediate layers 802 and 803 and the second intermediate layers 804 and 805. The first intermediate layers 802 and 803 are disposed to be adjacent to the first outer layer 801, and the second intermediate layers 804 and 805 are disposed to be adjacent to the second outer layer 806. For example, the first intermediate layers may be the second layer 802 and third layer 803 of the circuit board 800. The second intermediate layers may be the fourth layer 804 and fifth layer 805 of the circuit board 800.

Structures of the first intermediate layers 802 and 803 have been described in detail above with reference to FIGS. 7A and 7B.

The second intermediate layers 804 and 805 may be disposed to be stacked vertically while having the same structure as the first intermediates layer 802 and 803. The first intermediate layers 802 and 803 and the second intermediate layers 804 and 805 may be attached by interlayer adhesive 860. The first outer layer 801 may be attached by the first intermediate layers 802 and 803 and an interlayer adhesive 862. The second outer layer 806 may be attached by the second intermediate layers 804 and 805 and an interlayer adhesive 864.

The circuit board 800 includes the first and second regions 810 and 820 in the first intermediate layers 802 and 803 and the second intermediate layers 804 and 805. However, since structures of the first and second regions 810 and 820 have been described in detail above with reference to FIGS. 5A to 5C, descriptions thereof will be omitted.

Sizes of the first and second regions 810 and 820 may be changed. For example, horizontal widths or vertical thicknesses of the first and second regions 810 and 820 may be changed.

Figure 9A:
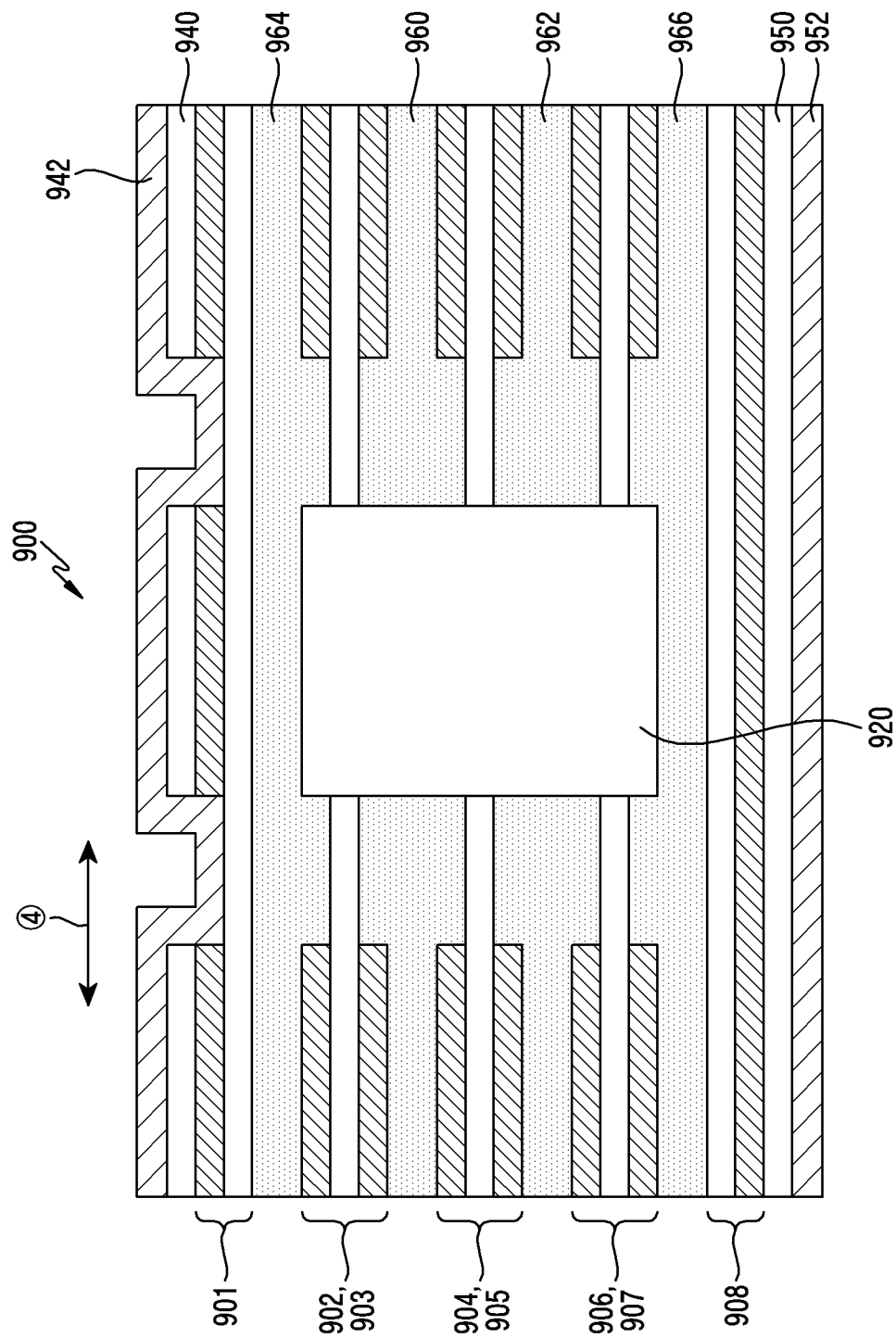
FIG. 9A illustrates an 8-layered circuit board according to an embodiment.
Figure 9B:
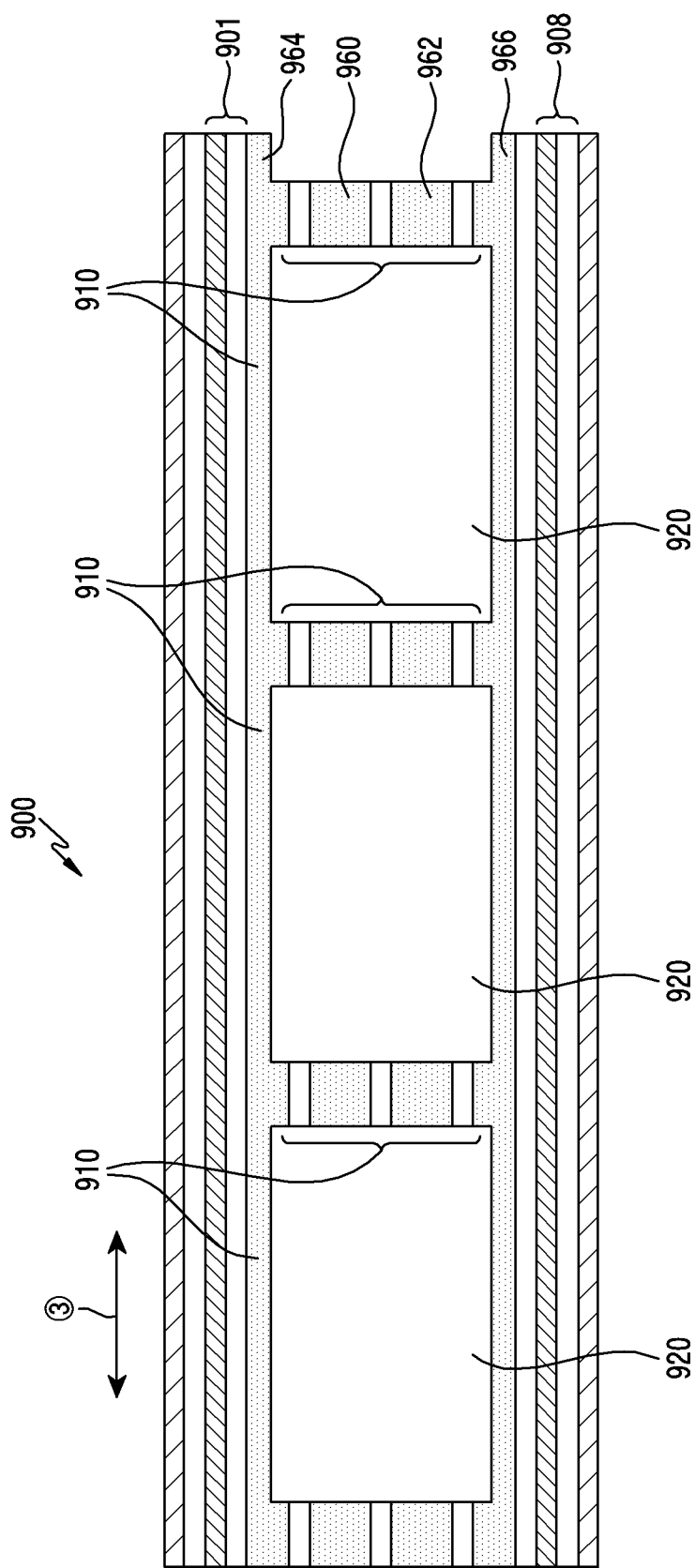
FIG. 9B illustrates an 8-layered circuit board according to an embodiment.

FIG. 9A illustrates an 8-layered circuit board according to an embodiment, and FIG. 9B illustrates an 8-layered circuit board according to an embodiment.

Referring to FIGS. 9A and 9B, a circuit board 900 includes a first outer layer 901, a second outer layer 908, and six intermediate layers 902 to 907. For example, the first outer layer 901 may be a first layer, the second outer layer 908 may be an eighth layer, and the intermediate layers 902 to 907 may be second to seventh layers.

The circuit board 900 differs from the circuit board 700 of FIGS. 7A and 7B in that the circuit board 900 has more intermediate layers, and thus, descriptions on the same remaining structures will be omitted to avoid redundancy.

The intermediate layers of the circuit board 900 include the first intermediate layers 902 and 903, the second intermediate layers 904 and 905, and the third intermediate layers 906 and 907. The first intermediate layers 902 and 903 are disposed to be adjacent to the first outer layer 901, the third intermediate layers 906 and 907 are disposed to be adjacent to the second outer layer 908, and the second intermediate layers 904 and 905 are disposed between the first intermediate layers 902 and 903 and the second intermediate layers 904 and 905. For example, the first intermediate layers 902 and 903 may be the second and third layers of the circuit board 900, the second intermediate layers 904 and 905 may be the fourth and fifth layers of the circuit board 900, and the third intermediate layers 906 and 907 may be the sixth and seventh layers of the circuit board 900.

Structures of the first intermediate layers 902 and 903 have been described in detail above with reference to FIGS. 7A and 7B. Each of the second intermediate layers 904 and 905 and the third intermediate layers 906 and 907 may be stacked vertically while having the same structure as the first intermediate layers 902 and 903. The first outer layer 901 may be attached by the first intermediate layers 902 and 903 and an interlayer adhesive 964. The second outer layer 908 may be attached by the third intermediate layers 906 and 907 and an interlayer adhesive 966. Further, the first intermediate layers 902 and 903 may be attached to the second intermediate layers 904 and 905 by interlayer adhesive 960, and the second intermediate layers 904 and 905 may be attached to the third intermediate layers 906 and 907 by interlayer adhesive 962.

The circuit board 900 includes the first and second regions 910 and 920 in the first intermediate layers 902 and 903, the second intermediate layers 904 and 905, and the third intermediate layers 906 and 907. Since structures of the first and second regions 910 and 920 have been described above in detail with reference to FIGS. 5A to 5C, descriptions thereof will be omitted.

Sizes of the first and second regions 910 and 920 may be changed. For example, horizontal widths or vertical thicknesses of the first and second regions 910 and 920 may be changed.

Figure 10A:
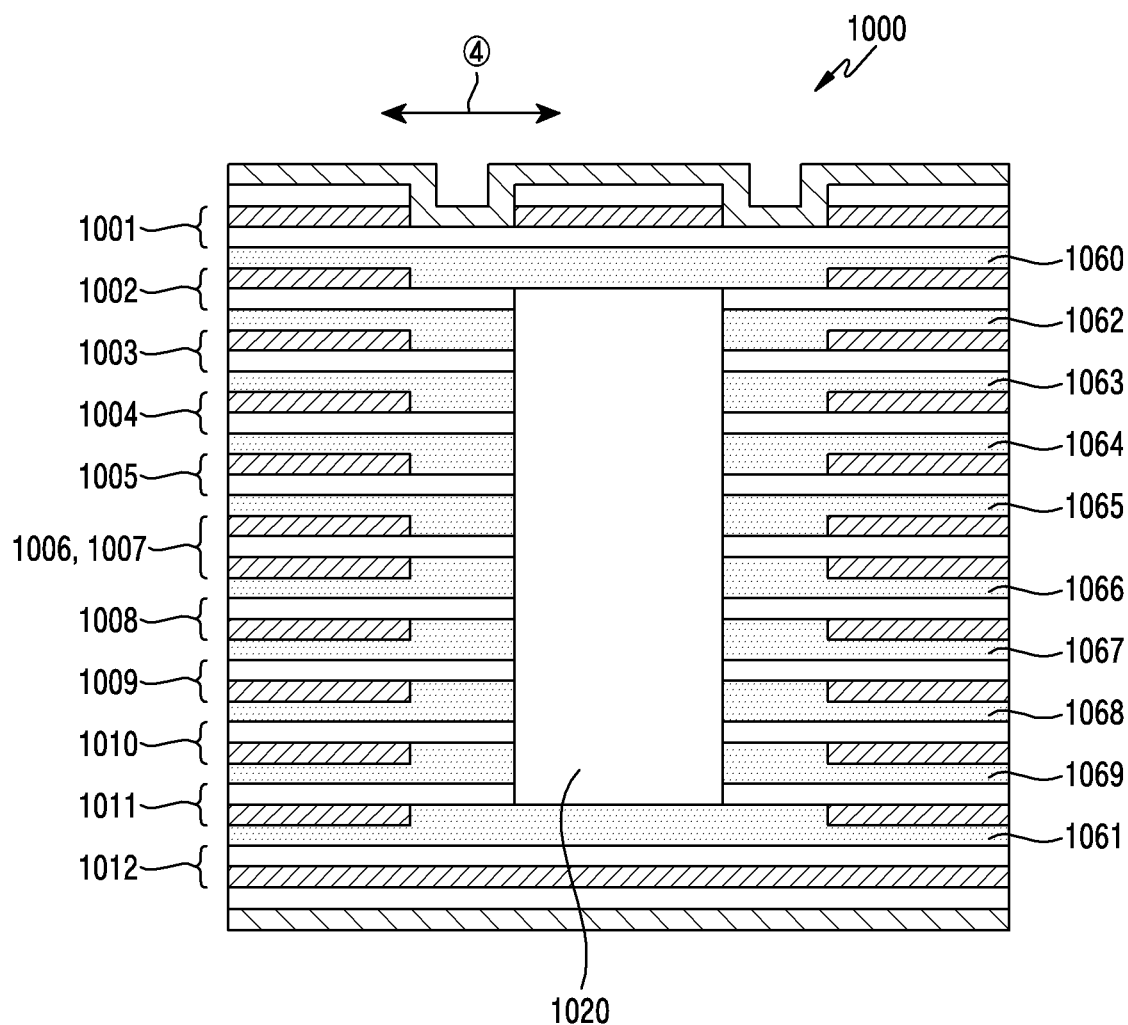
FIG. 10A illustrates a 12-layered circuit board according to an embodiment.
Figure 10B:
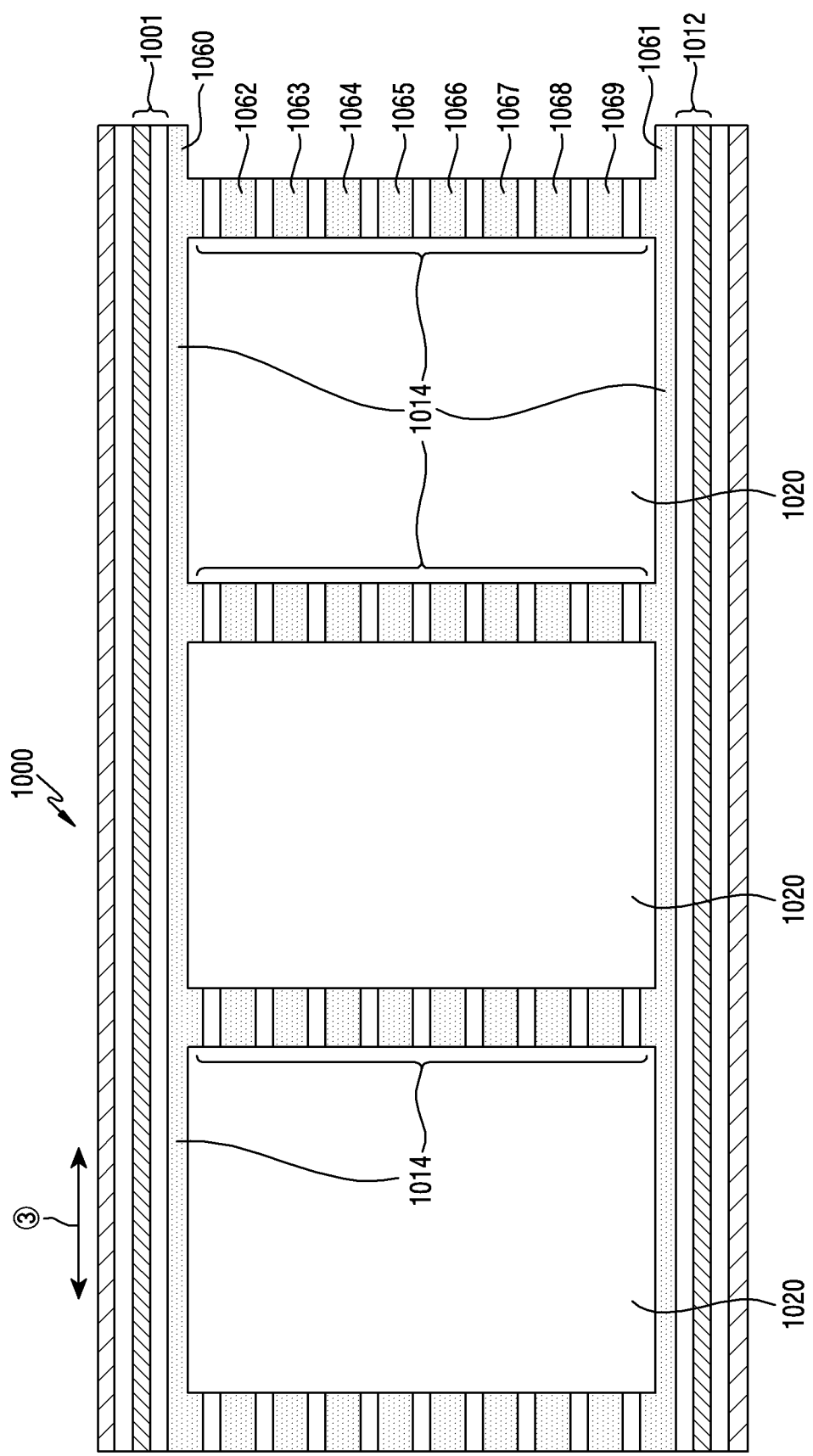
FIG. 10B illustrates a 12-layered circuit board according to an embodiment.

FIG. 10A illustrates a 12-layered circuit board according to an embodiment, and FIG. 10B illustrates a 12-layered circuit board according to an embodiment.

Referring to FIGS. 10A and 10B, a circuit board 1000 includes a first outer layer 1001, a second outer layer 1008, and ten intermediate layers 1002 to 1011. For example, the first outer layer 1001 may be a first layer, the second outer layer 1012 may be a twelfth layer, and the intermediate layers 1002 to 1011 may be second to eleventh layers.

The circuit board 1000 differs from the circuit board 700 of FIGS. 7A and 7B in that the circuit board 1000 has more intermediate layers, and thus descriptions on the same remaining structures will be omitted to avoid redundancy.

The intermediate layer of the circuit board 1000 includes the first to ninth intermediate layers 1002 to 1011. For example, the first intermediate layer 1002 may be a second layer of the circuit board, the second intermediate layer 1003 may be a third layer of the circuit board, the third intermediate layer 1004 may be a fourth layer of the circuit board, the fourth intermediate layer 1005 may be a fifth layer of the circuit board, the fifth intermediate layers 1006 and 1007 may be sixth and seventh layers of the circuit board, the sixth intermediate layer 1008 may be an eighth layer of the circuit board, The seventh layer 1009 may be a ninth layer of the circuit board, The eighth intermediate layer 1010 may be a tenth layer of the circuit board, and the ninth layer 1011 may be an eleventh layer of the circuit board.

Each of the intermediate layers 1002-1011 may be disposed to be vertically stacked to each other. The first to ninth intermediate layers 1002 to 1011 may be attached to each other by interlayer adhesives. For example, the first outer layer 1001 may be attached to the first intermediate layer 1002 by interlayer adhesive 1060, The second outer layer 1012 may be attached to the ninth intermediate layer 1011 by interlayer adhesive 1061.

The first intermediate layer 1002 may be attached to the second intermediate layer 1003 by interlayer adhesive 1062. The second intermediate layer 1003 may be attached to the third intermediate layer 1004 by interlayer adhesive 1063. The third intermediate layer 1004 may be attached to the fourth intermediate layer 1005 by interlayer adhesive 1064. The fourth intermediate layer 1005 may be attached to the fifth intermediate layer 1006 by interlayer adhesive 1065. The fifth intermediate layer 1006 may be attached to the sixth intermediate layer 1007 by interlayer adhesive 1066. The sixth intermediate layer 1007 may be attached to the seventh intermediate layer 1008 by an interlayer adhesive 1067. The seventh intermediate layer 1008 may be attached to the eighth intermediate layer 1009 by interlayer adhesive 1068. The eighth intermediate layer 1009 may be attached to the ninth intermediate layer 1010 by interlayer adhesive 1069.

In the circuit board 1000, the first and second regions 1014 and 1020 may be disposed on the first to ninth intermediate layers 1002 to 1011. Since structures of the first and second regions 1014 and 1020 are described above in detail with reference to FIGS. 5A to 5C, descriptions thereof will be omitted.

Sizes of the first and second regions 1014 and 1020 may be changed. For example, horizontal widths (e.g., a length extended along a transmission line) or vertical thicknesses of the first and second regions 1014 and 1020 may be changed.

Figure 11A:
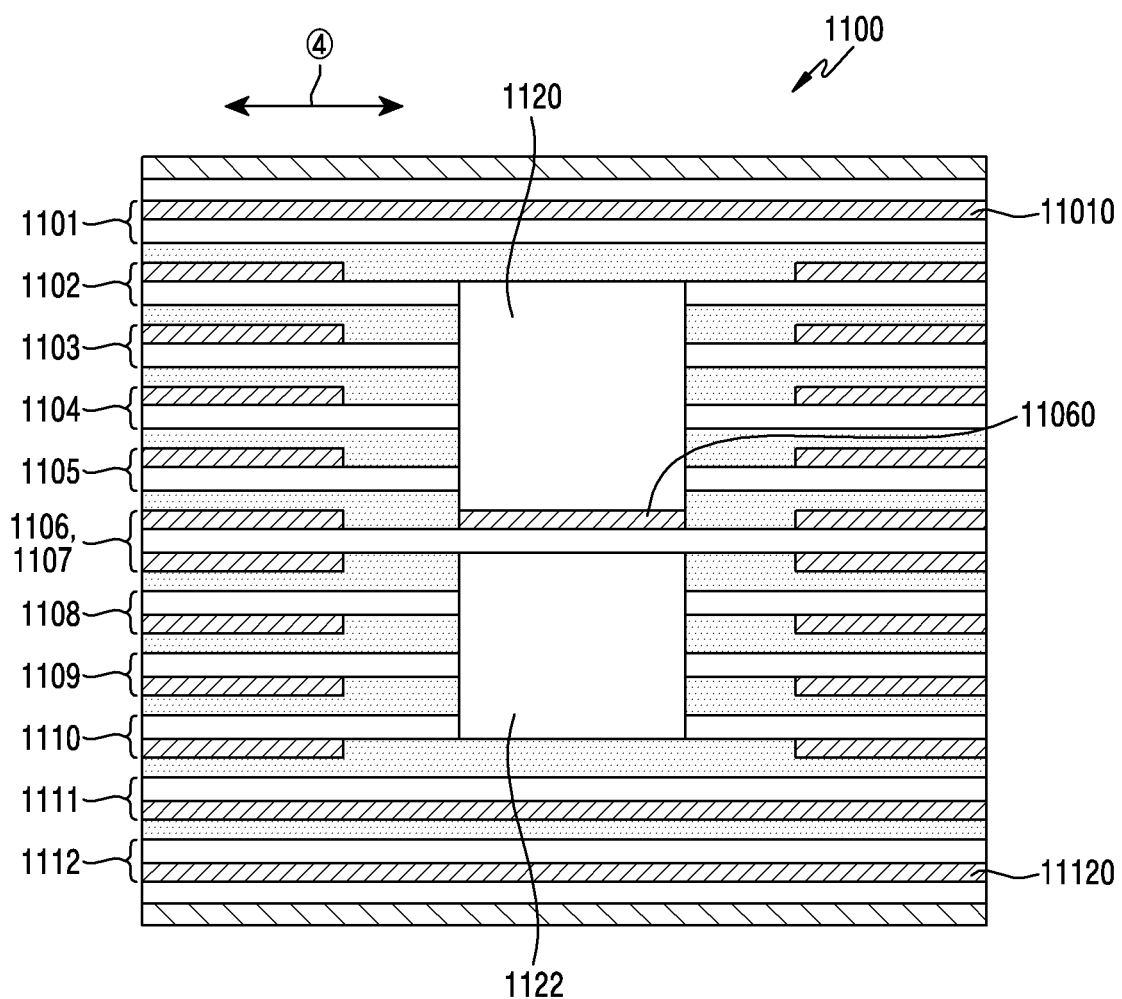
FIG. 11A illustrates a 12-layered circuit board according to an embodiment.
Figure 11B:
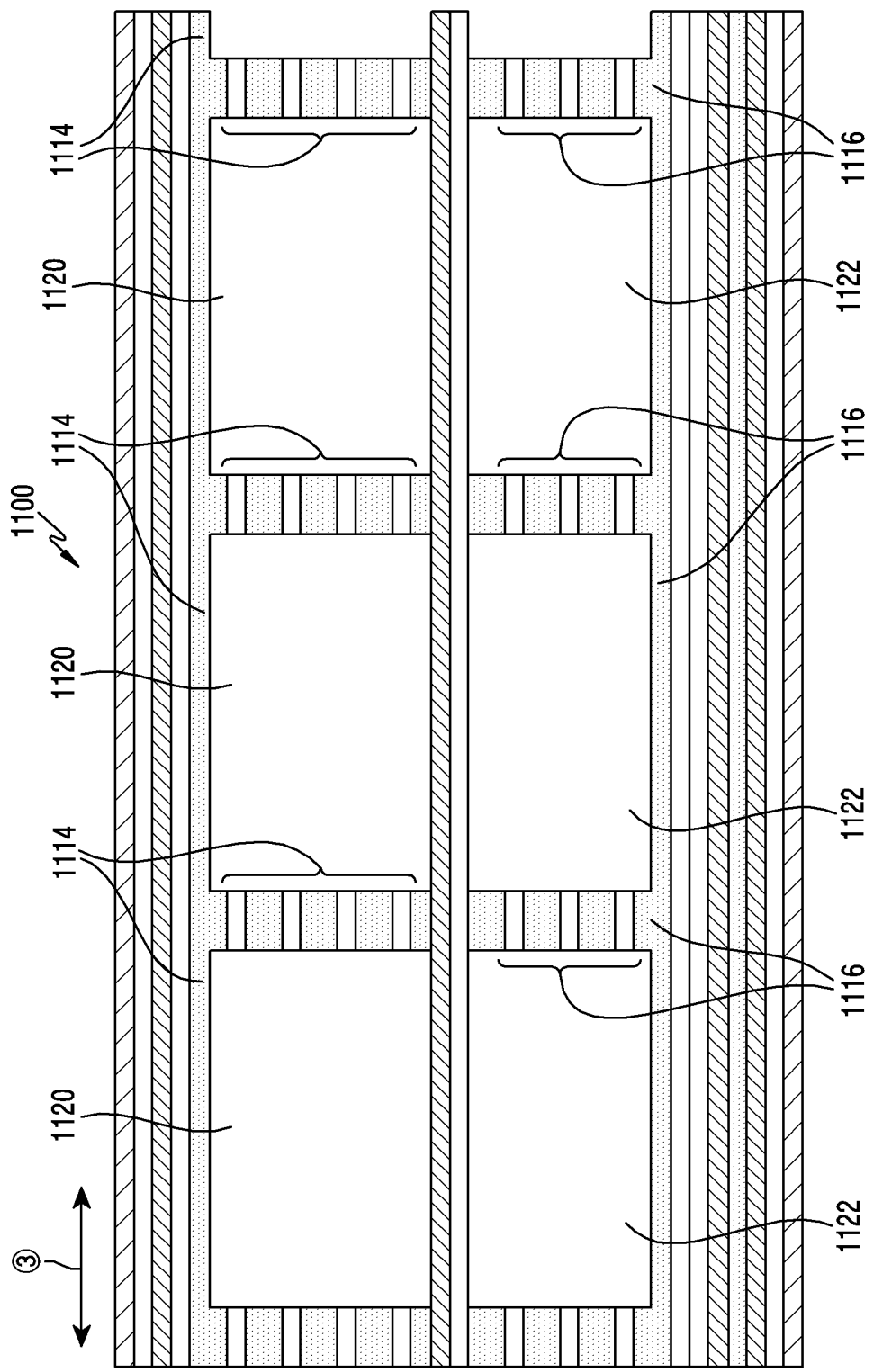
FIG. 11B illustrates a 12-layered circuit board according to an embodiment.

FIG. 11A illustrates a 12-layered circuit board according to an embodiment, and FIG. 11B illustrates a 12-layered circuit board according to an embodiment.

Referring to FIGS. 11A and 11B, a circuit board 1100 includes a first outer layer 1101, a second outer layer 1112, and ten intermediate layers 1102 to 1111. For example, the first outer layer 1101 may be a first layer, the second outer layer 1112 may be a twelfth layer, and the intermediate layers 1102 to 1111 may be second to eleventh layers, respectively. Since the layer structure of the circuit board 1100 is identical to the layer structure of the circuit board 1000 of FIG. 10A and FIG. 10B, detailed descriptions thereof may be omitted.

The circuit board 1100 differs from the circuit board 700 of FIGS. 7A and 7B in that the circuit board 1100 has more intermediate layers. Thus, descriptions on the same remaining structures will be omitted to avoid redundancy.

The circuit board 1100 may have a transmission line disposed on a layer inside a circuit, i.e., any one layer among the second layer 1102 to the eleventh layer 1111. For example, a transmission line 11060 is located in the sixth layer 1106 of the circuit board 1100. The first and second regions 1114 and 1120 may be disposed in a first direction of the transmission line with respect to the transmission line 11060, and the third and fourth regions 1116 and 1122 may be disposed in a second direction opposite to the first direction of the transmission line. The first and second regions 1114 and 1120 may correspond to and replace the third and fourth regions 1116 and 1122 with respect to the transmission line 11060. The first and second regions 1114 and 1120 may be disposed on the second to fifth intermediate layers 1102 and 1106. The third and fourth regions 1116 and 1122 may be disposed on the sixth to tenth intermediate layers 1107 and 1110.

According to a position at which the transmission line 11060 is constructed, positions at which the first and second regions and the third and fourth regions are constructed may change, and the number of regions to be constructed may also change.

Conductive layers 11010 and 11120 of the first and eleventh layers of the circuit board may be used as a ground layer.

Figure 12:
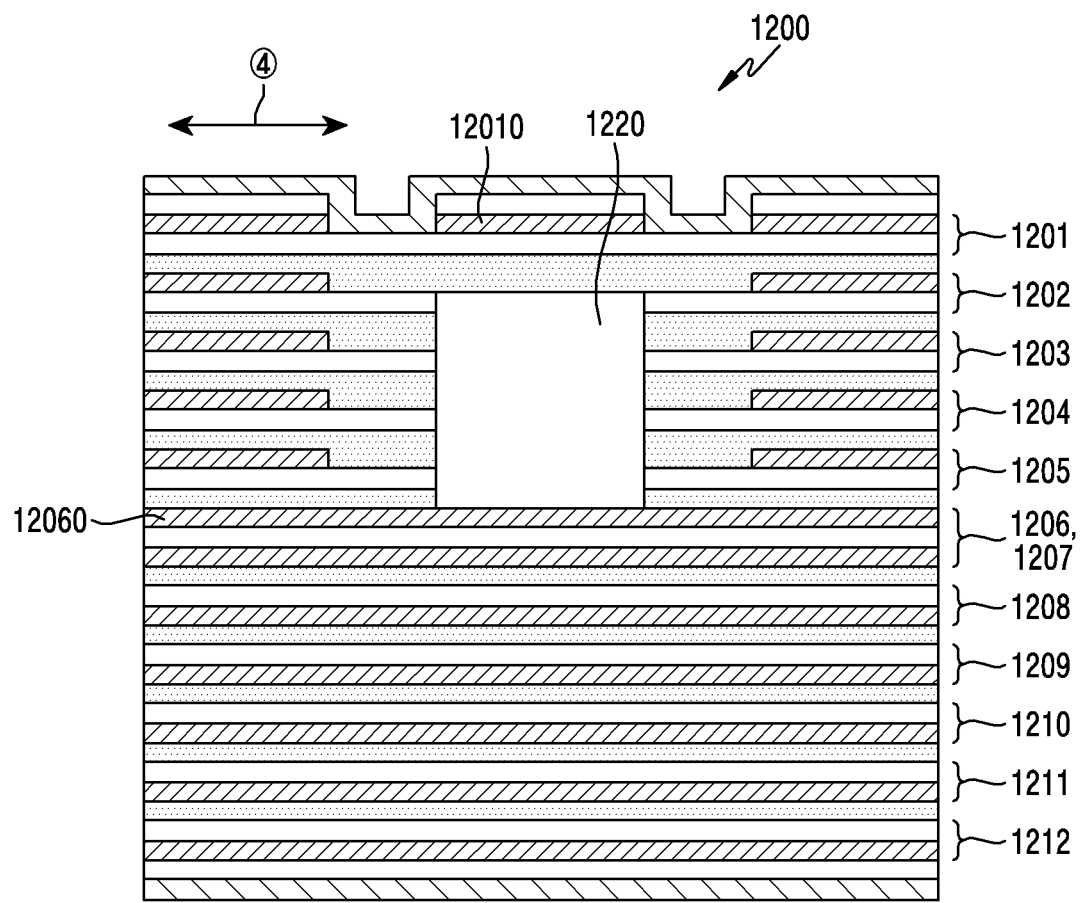
FIG. 12 illustrates a 12-layered circuit board according to an embodiment.

FIG. 12 illustrates a 12-layered circuit board according to an embodiment.

Referring to FIG. 12, a circuit board 1200 includes a first outer layer 1201, a second outer layer 1212, and ten intermediate layers 1202 to 1211. For example, the first outer layer 1201 may be a first layer, the second outer layer 1212 may be a twelfth layer, and the intermediate layers 1202 to 1211 may be second to eleventh layers, respectively. Since the layer structure of the circuit board 1200 is identical to the layer structure of the circuit board 1000 of FIG. 10A and FIG. 10B, detailed descriptions thereof may be omitted.

The circuit board 1200 differs from the circuit board 700 of FIGS. 7A and 7B in that the circuit board 1200 has more intermediate layers, and the first and second regions 1214 and 1220 are disposed on the first to fifth intermediate layers 1202 to 1206. Thus, descriptions on the same remaining structures will be omitted to avoid redundancy.

The circuit board 1200 includes a transmission line 12010 disposed on the first layer 1201 and a ground layer 12060 disposed on the sixth layer 1206. The second region 1220 may be constructed between the transmission line 12010 and the ground layer 12060, e.g., between the second and sixth layers. The second region 1220 has a shape of an opening, and may be exposed to the air by being filled with the air. For example, the ground layer 12060 may be exposed to the opening and thus may be exposed to the air having a permittivity.

Figure 13:
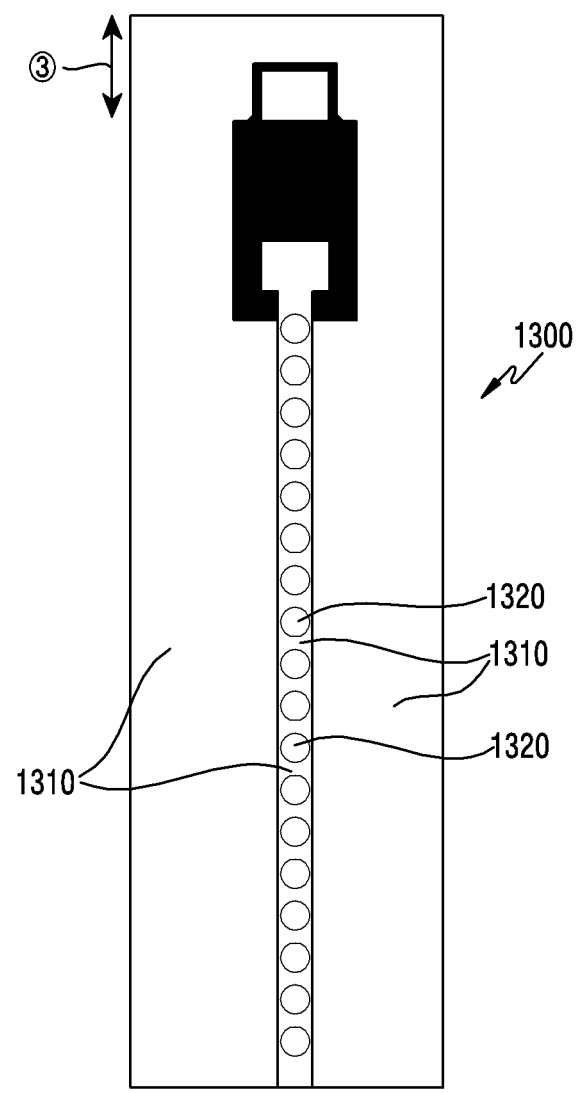
FIG. 13 illustrates a circuit board according to an embodiment.

FIG. 13 illustrates a circuit board according to an embodiment.

Referring to FIG. 13, a circuit board 1300 includes a first region 1310 and a second region 1320 in a second layer. The circuit board 1300 differs from the circuit board 500 of FIG. 5A only in a shape of the second region 1320, and thus, descriptions on the same remaining structures will be omitted to avoid redundancy.

In the circuit board 1300, at least part of the first region 1310 and the second region 1320 may be repeatedly arranged along a longitudinal direction (a direction of an arrow ③) of the transmission line, and may be equidistantly and regularly arranged. For example, the second region 1320 has a cylindrical shape, and may be constructed between at least some parts of the first region 1310 so as to be supported by the first region 1010. The shape of the second region 1320 is not necessarily limited to the cylindrical shape, and thus, various polygonal column shapes or a shape extended along the transmission line may also be possible.

Figure 14:
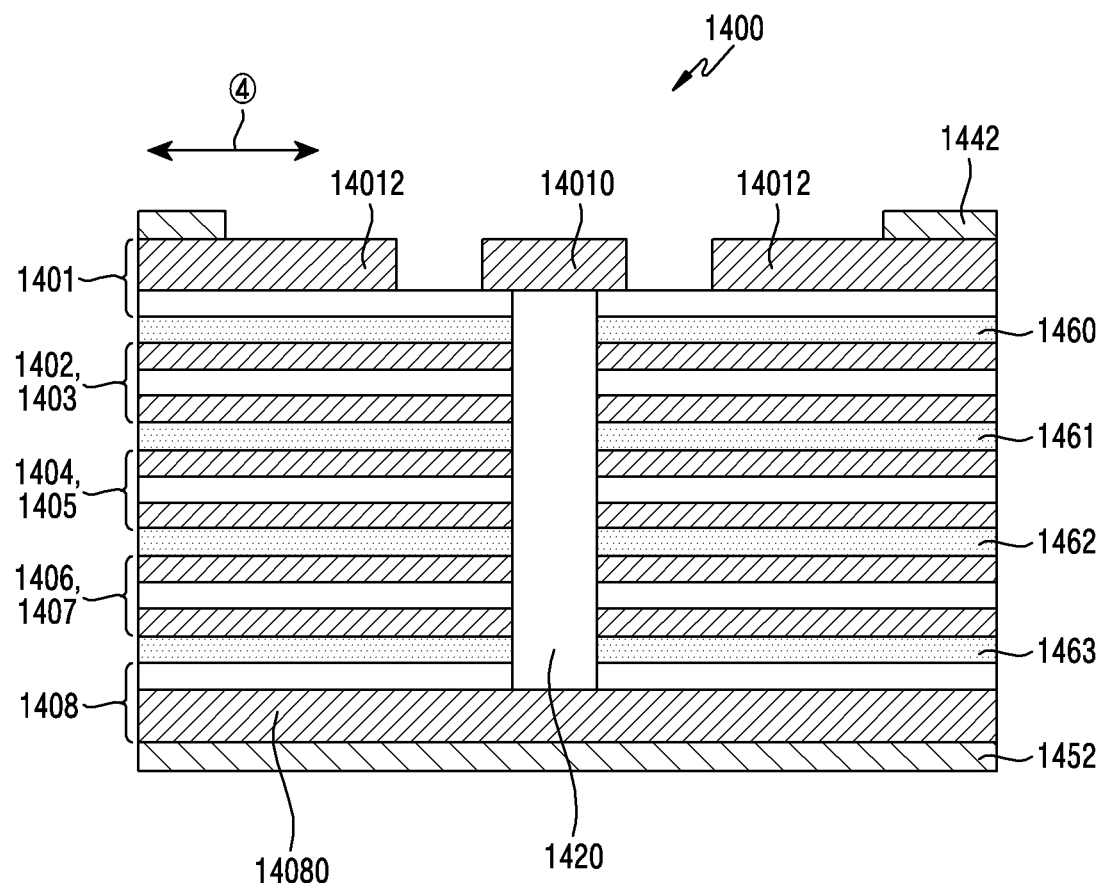
FIG. 14 illustrates an 8-layered circuit board according to an embodiment.

FIG. 14 illustrates an 8-layered circuit board according to an embodiment.

Referring to FIG. 14, a circuit board 1400 includes a first outer layer 1401, a second outer layer 1408, and six intermediate layers 1402 to 1407. For example, the first outer layer 1401 may be a first layer, the second outer layer 1408 may be an eighth layer, and the intermediate layers 1402 to 1407 may be second to seventh layers, respectively.

The circuit board 1400 includes a transmission line 14010 disposed on the first layer 1401, and a first ground layer 14012 disposed at both sides of the transmission line 14010. The second region 1420 may be constructed between the transmission line 14010 and a second ground layer 14080, e.g., between the first to eighth layers 1401 to 1408. The second region 1420 has a shape of an opening, and may be exposed to the air by being filled with the air. For example, the ground layer 14010 may have one side exposed to the air and the other side exposed to the second region (opening), and thus, all sides may be exposed to the air having a permittivity.

The layers of the circuit board 1400 may be vertically stacked by adhesives 1460 to 1463. For example, the second and third layers 1402 and 1403 may be attached by first adhesive 1460, the second and third layers 1420 and 1403 may be attached to the fourth and fifth layers 1404 and 1405 by second adhesive 1461, the fourth and fifth layers 1404 and 1405 may be attached to the sixth and seventh layers 1406 and 1407 by third adhesive 1462, and the sixth and seventh layers 1406 and 1407 may be attached to the eighth layer 1408 by fourth adhesive 1464.

The second region 1420 may extend in the longitudinal direction of the transmission line 14010 as shown in FIG. 5B, and a plurality of the regions may be constructed repeatedly. The second region 1420 (the opening) disposed on the circuit board is not necessarily limited to be constructed between the first to eighth layers, and may be constructed with various thicknesses in various layers. In addition, the second region 1420, i.e., the opening, may have a shape of any one of the openings of FIG. 5A and FIG. 13 or a combination thereof.

The circuit board 1400 can reduce a transmission line loss caused by a physical property of a dielectric material by removing a space between the transmission line 14010 and the first ground layer 14012, by removing a dielectric layer existing on a first side of the transmission line 14010, and by removing a dielectric layer existing on a second side of the transmission line 14010.

Figure 15:
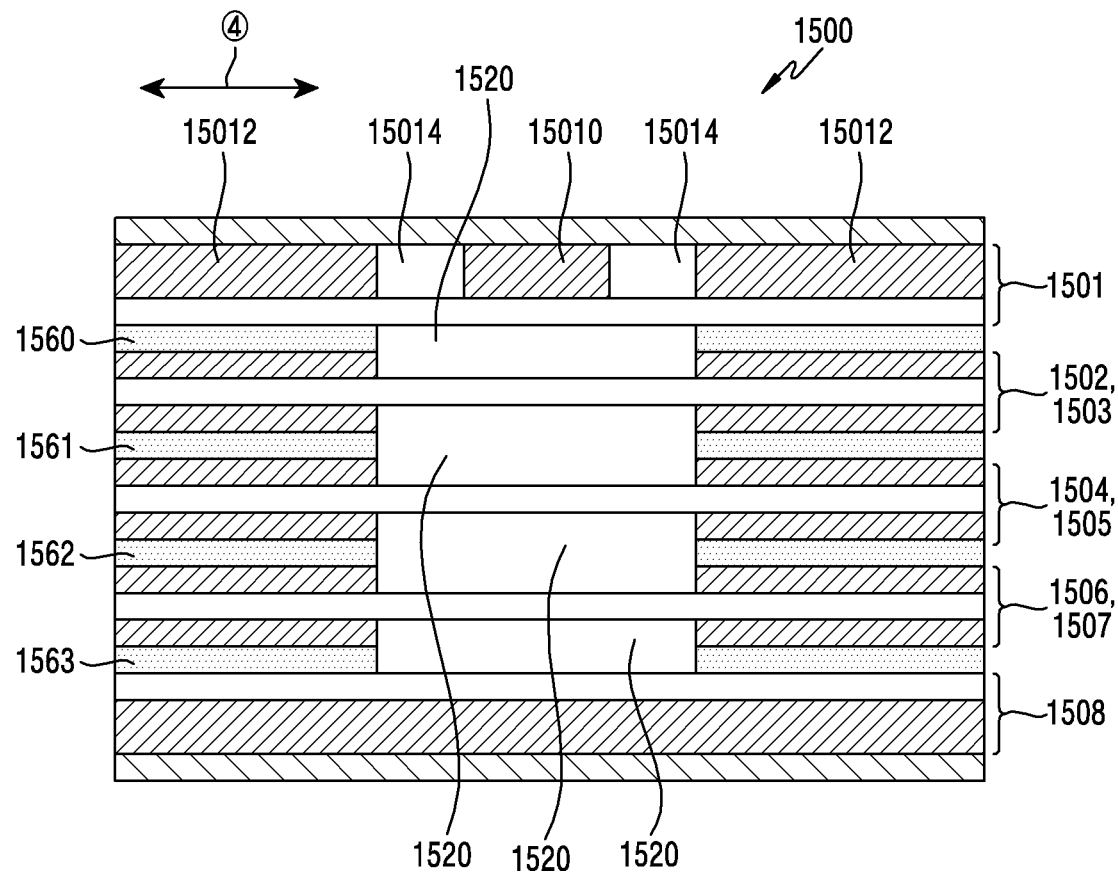
FIG. 15 illustrates an 8-layered circuit board according to an embodiment.

FIG. 15 illustrates an 8-layered circuit board according to an embodiment.

Referring to FIG. 15, a circuit board 1500 includes a first outer layer 1501, a second outer layer 1508, and six intermediate layers 1502 to 1507. For example, the first outer layer 1501 may be a first layer, the second outer layer 1508 may be an eighth layer, and the intermediate layers 1502 to 1507 may be second to seventh layers.

The circuit board 1500 includes a transmission line 15010 disposed on the first layer 1501, and a ground layer 15012 disposed at both sides of the transmission line 15010. The circuit board 1500 may remove a dielectric layer between the transmission line 15010 and the ground layer 15012, and may remove a dielectric layer disposed on each layer in a lower side of the transmission line 15010.

The circuit board 1500 may have respective layers attached to be vertically stacked by adhesives. For example, the second and third layers 1502 and 1503 may be attached by first adhesive 1560, the second and third layers 1520 and 1503 may be attached to the fourth and fifth layers 1504 and 1505 by second adhesive 1561, the fourth and fifth layers 1504 and 1505 may be attached to the sixth and seventh layers 1506 and 1507 by third adhesive 1562, and the sixth and seventh layers 1506 and 1507 may be attached to the eighth layer 1508 by fourth adhesive 1564.

The circuit board 1500 can reduce the transmission line loss by removing a dielectric layer of both sides of the transmission line 15010 and a dielectric layer of a lower side thereof. The circuit board 1500 may be manufactured by removing a dielectric layer of each circuit board, and thereafter, compressing it into a single body with high temperature. Reference numeral 1520 denotes a second region (opening) in which a dielectric layer is removed, and reference numeral 15014 denotes an opening in which a dielectric layer between a transmission line and a ground layer is removed.

FIG. 16A to FIG. 16D illustrate a manufacturing method of an 8-layered circuit board according to an embodiment.

Figure 16A:
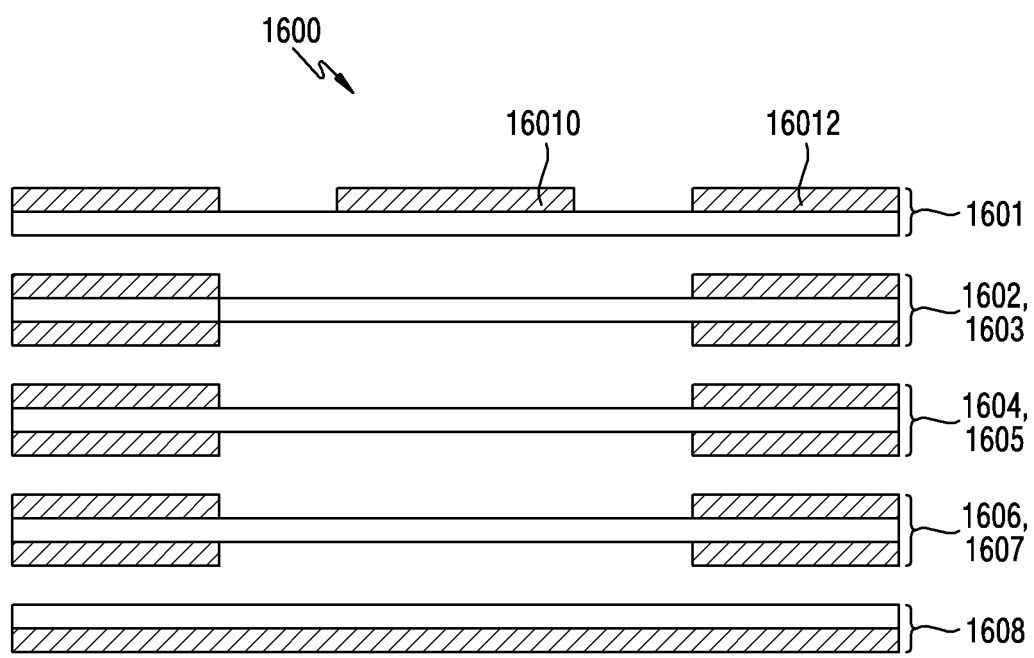
FIG. 16A to FIG. 16D illustrate a manufacturing method of an 8-layered circuit board according to an embodiment.

Referring to FIG. 16A, the circuit board 1600 includes a first layer 1601 to an eighth layer 1608. A transmission line 1601 of the circuit board 1600 may be disposed on the first layer 1601, and a ground layer 16012 may be disposed on both sides of the transmission line 16010. In each of the circuit board layers 1601 to 1608, a dielectric layer may be in a fill cut state.

Figure 16B:
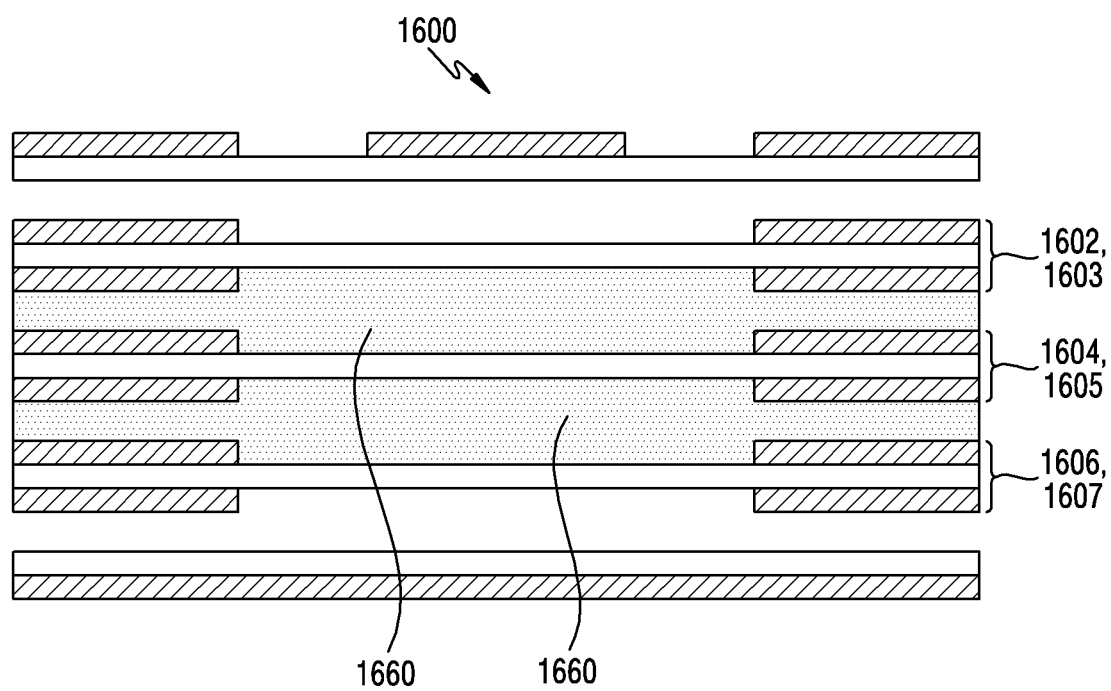

Referring to FIG. 16B, the second layer 1602 to the seventh layer 1607, except for the first layer 1601 and the eighth layer 1608, may be constructed as a single body by being laminated through a compression process with high temperature. According to the high-temperature compression process, a space between the third layer 1603 to the sixth layer 1606 of the circuit board 1600 may be filled with an adhesive 1660, which is an insulator.

Figure 16C:
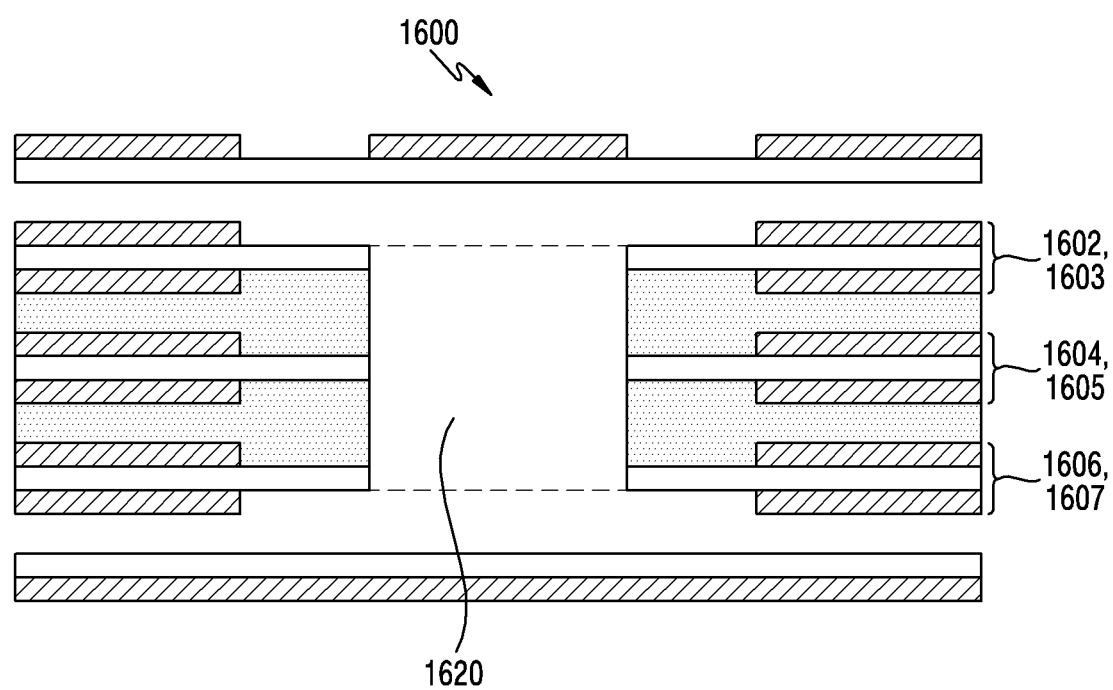

Referring to FIG. 16C, a circuit board subjected to the high-temperature compression process of the second to sixth layers 1602 to 1606 may construct an opening 1620 which is open vertically between the second to sixth layers 1602 to 1606 by using a drill.

Figure 16D:
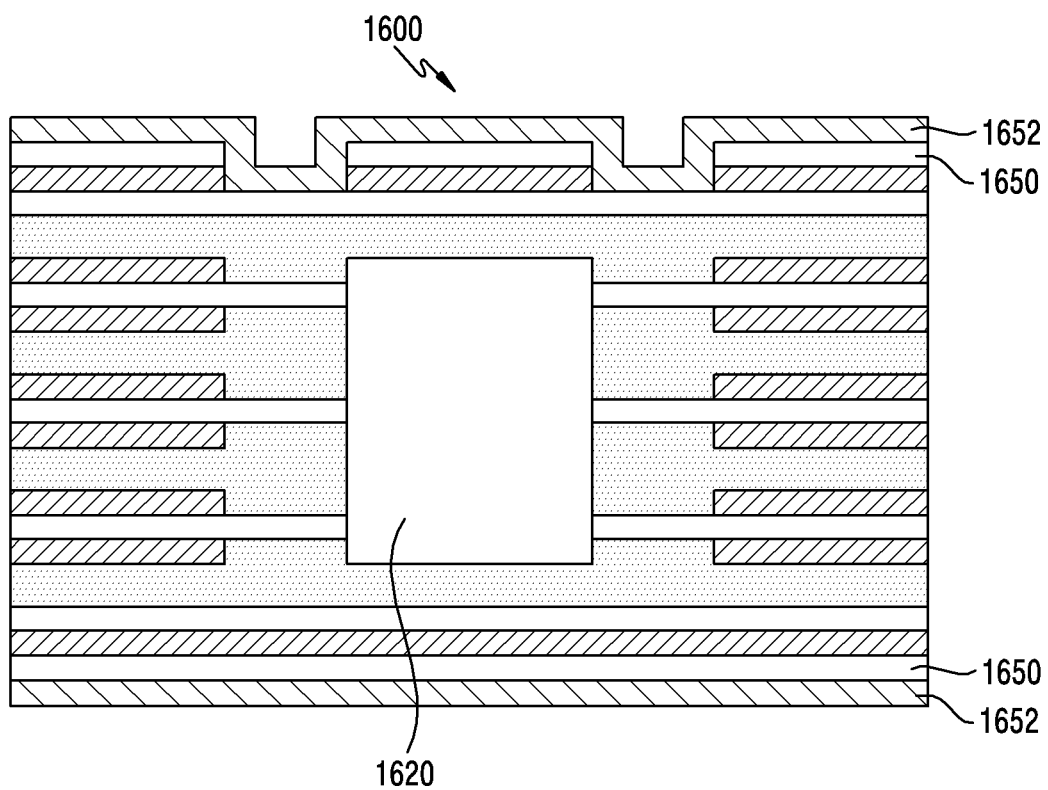

Referring to FIG. 16D, the circuit board 1600 having the openings 1620 constructed between the second to sixth layers 1602 to 1606 may laminate the first layer 1601 and the eighth layer 1608 together through the high-temperature compression process. Subsequently, an outer layer 1650 of the laminated circuit board may be plated and is applied with a photoimageable solder resist (PSR) 1652, thereby completing the manufacturing of the final circuit board 1600.

As described above, e.g., in FIGS. 5A to 5C, the circuit board 500 includes the first layer 501, the second layer 502 stacked with the first layer 501, and the transmission line 530 disposed on the first layer 501. Among regions of the second layer 502 corresponding to a position of the transmission line 503, the first region 510 may be constructed of a first material constituting the second layer 502. Among regions corresponding to the position of the transmission line 530, the second region 520 may be constructed of a second material of which a permittivity is different from that of the first material.

The circuit board 500 may have the second layer 502 stacked on a lower end of the first layer 501.

The circuit board 600 may further include the third layer 603 stacked on an upper end of the first layer 601.

In the circuit board 600, the third region 640 may be constructed of a third material constituting the third layer 603 among regions of the third layer 603, and the fourth region 605 may be constructed of a fourth material of which a permittivity is different from that of the third material among the regions of the third layer 603 corresponding to the transmission line 630.

In the circuit board 600, the fourth material may be identical to the second material.

In the circuit board 600 e, the third region 640 may be disposed at a position corresponding to the first region 610 and the fourth region 650 may be disposed at a position corresponding to the second region 620.

The circuit board 500 may include a first support structure in which the first region 510 supports the second region 520.

In the circuit board 500, at least one second region 520 may be constructed along a longitudinal direction of the transmission line 530, and each of the second regions 520 may be arranged repeatedly and regularly among an extension direction of the transmission line 530.

In the circuit board 500, the first material may be a dielectric material, and the second material may include the air.

In the circuit boards 410 and 412, the transmission lines 441 to 443 may have one end electrically coupled to the RF block 4101 and the other end electrically coupled to the antenna radiators 421 to 423, and the antenna radiators 421 to 423 may include at least one segmented external metal frame of the electronic device.

In the circuit board 500, the second region 520 may include at least one opening, and the opening may extend along the transmission line 530.

The circuit board 500 may be constructed of any one of a rigid material, a flexible material, and a combination of the rigid material and the flexible material.

An electronic device according to an embodiment may include a housing comprising a first side facing a first direction, a second side facing a second direction opposite to the first direction, and a lateral side facing a third direction perpendicular to the first and second directions and covering at least part of a space between the first and second sides, a bracket coupled to the housing, a display module supported by being disposed in a first direction of the bracket, a circuit board supported by being disposed in a second direction of the bracket, and at least one segmented external metal frame disposed along the third direction of the housing and coupled to cover at least part of the lateral side.

The circuit board may include a first dielectric layer, a second dielectric layer stacked with the first dielectric layer, and a conductive layer disposed on the first dielectric layer. A first region may be constructed of a first material constituting the second dielectric layer among regions of the second dielectric layer. A second region may be adjacent to the first region and may be constructed of a second material of which a permittivity is different from that of the first material among the regions of the second dielectric layer corresponding to a position of the conductive layer.

The circuit board 500 may have the conductive layer 530 electrically coupled to the segmented external metal framed 421 and 423, and thus the segmented external metal frames 421 to 423 may operate as an antenna radiator.

The circuit board 500 may have the second region 520 repeatedly arranged along the conductive layer 530.

The circuit board 500 may have a support structure supporting the second region 520 in such a manner that at least part of the first region 510 is disposed between the second regions 520.

The support structure of the circuit board may include at least one first dielectric layer 701 stacked in a vertical direction, and one or more interlayer adhesive layers 760 and 762 disposed between the first dielectric layers 701.

The circuit board 500 may include the first layer 501, the second layer 502 stacked with the first layer 501, and the transmission line 530 disposed on the first layer 501. Among regions of the second layer 502, the first region 510 may be constructed of a first material constituting the second layer 502. Among regions corresponding to the position of the transmission line 530, the second region 520 may be constructed of a second material of which a permittivity is different from that of the first material. The first region 510 may include a first support structure supporting the second region 520. The first support structure may include the first material located to be stacked in a layered manner so as to be spaced vertically and the one or more interlayer adhesive layers 760 and 752, each of which is disposed between the first materials.

The circuit board 600 may further include the third layer 603 stacked on an upper end of the first layer 601. Among regions of the third layer 603, the third region 610 may be constructed of a third material constituting the third layer 603. Among regions of the third layer 603 corresponding to the transmission line 630, the fourth region 620 may be constructed of a fourth material of which a permittivity is different from that of the third material. At least part of the third region 630 may be constructed with a second support structure supporting the fourth region 640. The second support structure may be constructed to be stacked vertically with respective to the first support structure.

The circuit board may include at least one third material located in a layered manner to be spaced vertically, and at least one adhesive layer, each of which is disposed between the third materials.

The computer readable recoding medium includes magnetic media such include magnetic media, such as a hard disk, a floppy disk and a magnetic tape, optical media, such as a Compact Disc Read Only Memory (CD-ROM) and a Digital Versatile Disc (DVD), magneto-optical media, such as a floptical disk, and a hardware device specially configured to store and execute a program command, such as a Read Only Memory (ROM), a Random Access Memory (RAM) and a flash memory. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Furthermore, some operations may be executed in a different order or may be omitted, or other operations may be added.

As described above, an embodiment of the present disclosure can improve a transmission loss when a transmission line of a printed circuit board is implemented, and can improve a transmission loss, which may occur in a section of a transmission line greater than or equal to a predetermined distance, e.g., 10 mm.

While the present disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and any equivalents thereof.

What is claimed is:

1. A circuit board, comprising:
    a first layer;
    a transmission line disposed on the first layer; and
    a second layer stacked with the first layer,
    wherein the second layer comprises:
        a first region, which is constructed of a first material, corresponding to a first portion of the transmission line, and
        a second region, which is constructed of a second material having a permittivity that is different from that of the first material, corresponding to a second portion of the transmission line,
    wherein the second portion of the transmission line is different from the first portion of the transmission line,
    wherein the first region comprises a first support structure supporting the second region, and
    wherein the first support structure comprises:
        the first material located stacked in a layered manner and spaced vertically; and
        an interlayer adhesive layer, which is disposed between the first layered materials.

2. The circuit board of claim 1, wherein the second layer is stacked on a lower end of the first layer.

3. The circuit board of claim 1, wherein the second region is disposed along a longitudinal direction of the transmission line, and
    wherein the second region is arranged repeatedly and regularly along an extension direction of the transmission line.

4. The circuit board of claim 1, wherein the first material comprises a dielectric material, and
    wherein the second material comprises air.

5. The circuit board of claim 1, wherein the transmission line comprises:
   a first end electrically coupled to a Radio Frequency (RF) block; and
   a second end electrically coupled to an antenna radiator, and
   wherein the antenna radiator comprises a segmented external metal frame of an electronic device.

6. The circuit board of claim 1, wherein the second region comprises an opening that extends along the transmission line.

7. The circuit board of claim 1, wherein the circuit board is constructed of one of a rigid material, a flexible material, and a combination of the rigid material and the flexible material.

8. The circuit board of claim 1, further comprising a third layer stacked on an upper end of the first layer,
   wherein the third layer comprises:
      a third region that is constructed of a third material, and
      a fourth region, which is constructed of a fourth material having a permittivity that is different from that of the third material, corresponding to the transmission line,
   wherein the third region comprises a second support structure supporting the fourth region, and
   wherein the second support structure is stacked vertically with respective to the first support structure.

9. The circuit board of claim 2, further comprising a third layer stacked on an upper end of the first layer.

10. The circuit board of claim 8, wherein the second support structure comprises:
    a third material disposed in a layered manner and spaced vertically; and
    an adhesive layer, which is disposed between the layered third materials.

11. The circuit board of claim 9, wherein third layer comprises:
    a third region, which is constructed of a third material, and
    a fourth region, which is constructed of a fourth material having a permittivity that is different from that of the third material, corresponding to the transmission line.

12. The circuit board of claim 11, wherein the fourth material is identical to the second material.

13. The circuit board of claim 11, wherein the third region is disposed at a position corresponding to the first region, and the fourth region is disposed at a position corresponding to the second region.

14. An electronic device, comprising:
    a housing;
    a display;
    a circuit board; and
    a segmented external metal frame,
    wherein the circuit board comprises:
       a first dielectric layer;
       a conductive layer disposed on the first dielectric layer; and
       a second dielectric layer stacked with the first dielectric layer,
    wherein the second dielectric layer comprises:
       a first region, which is constructed of a first material, corresponding to a first portion of the conductive layer, and
       a second region, which is adjacent to the first region and is constructed of a second material having a permittivity that is different from that of the first material, corresponding to a second portion of the conductive layer,
    wherein the second portion of the conductive layer is different from the first portion of the conductive layer,
    wherein the first region comprises a first support structure supporting the second region, and
    wherein the first support structure comprises:
       the first material located stacked in a layered manner and spaced vertically; and
       an interlayer adhesive layer, which is disposed between the first layered materials.

15. The electronic device of claim 14, wherein the conductive layer is electrically coupled to the segmented external metal frame, and
    wherein the segmented external metal frame operates as an antenna radiator.

16. The electronic device of claim 14, wherein the second region is repeatedly arranged along the conductive layer.

* * * * *